US 6,657,243 B2

(12) United States Patent
Kumagai et al.

(10) Patent No.: US 6,657,243 B2
(45) Date of Patent: *Dec. 2, 2003

(54) SEMICONDUCTOR DEVICE WITH SRAM SECTION INCLUDING A PLURALITY OF MEMORY CELLS

(75) Inventors: Takashi Kumagai, Chino (JP); Masahiro Takeuchi, Chino (JP); Satoru Kodaira, Chino (JP); Takafumi Noda, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/945,164

(22) Filed: Aug. 31, 2001

(65) Prior Publication Data

US 2002/0063267 A1 May 30, 2002

(30) Foreign Application Priority Data

Sep. 4, 2000 (JP) ........................................ 2000-266794

(51) Int. Cl.[7] .............................................. G11C 11/00
(52) U.S. Cl. ..................... 257/206; 257/904; 257/903; 257/221; 365/154; 365/156
(58) Field of Search ............................... 365/154, 156; 257/202, 203, 206, 221, 903, 904

(56) References Cited

U.S. PATENT DOCUMENTS

| | | | | |
|---|---|---|---|---|
| 6,218,707 B1 | * | 4/2001 | Soldavini | 257/371 |
| 6,347,048 B2 | * | 2/2002 | Kumagai et al. | 365/154 |
| 6,359,804 B2 | * | 3/2002 | Kuriyama et al. | 365/154 |
| 6,455,904 B1 | * | 9/2002 | Noda | 257/393 |

FOREIGN PATENT DOCUMENTS

| | | |
|---|---|---|
| JP | 05-013721 | 1/1993 |
| JP | 05-152546 | 6/1993 |
| JP | 11-017134 | 1/1999 |

OTHER PUBLICATIONS

U.S. patent application Ser. No. 09/764,449, Kumagai et al., filed Jan. 19, 2001.
U.S. patent application Ser. No. 09/736,386, Kumagai et al., filed Dec. 15, 2000.
U.S. patent application Ser. No. 09/876,059, Kumagai et al., filed Jun. 08, 2001.
U.S. patent application Ser. No. 09/827,155, Kumagai et al., filed Apr. 6, 2001.
U.S. patent application Ser. No. 09/827,391, Kumagai et al., filed Apr. 6, 2001.
U.S. patent application Ser. No. 09/841,105, Kumagai et al., filed Apr. 25, 2001.
U.S. patent application Ser. No. 09/876,056, Kumagai et al., filed Jun. 08, 2001.
U.S. patent application Ser. No. 09/876,058, Kumagai et al., filed Jun. 8, 2001.
U.S. patent application Ser. No. 09/876,068, Kumagai et al., filed Jun. 8, 2001.

* cited by examiner

Primary Examiner—Minh Loan Tran
Assistant Examiner—Thomas L Dickey
(74) Attorney, Agent, or Firm—Hogan & Hartson LLP

(57) ABSTRACT

A semiconductor device having an SRAM section in which a p-well, a first n-well, and a second n-well are formed in a semiconductor substrate. Two n-type access transistors and two n-type driver transistors are formed in the p-well. Two p-type load transistors are formed in the first n-well. The second n-well is located under the p-well and the first n-well and also is connected to the first n-well. The potential of the first n-well is supplied from the second n-well. According to the present invention, the SRAM section can be reduced in size.

27 Claims, 25 Drawing Sheets

SEMICONDUCTOR DEVICE WITH SRAM SECTION INCLUDING A PLURALITY OF MEMORY CELLS

Japanese Patent Application No. 2000-266794, filed Sep. 4, 2000, is hereby incorporated by reference in its entirety.

BACKGROUND OF THE INVENTION

1. Filed of the Invention

The present invention relates to a semiconductor device including a semiconductor memory device such as a static random access memory (SRAM).

2. Related Art

An SRAM is one type of semiconductor memory device and does not need refreshing. Therefore, the SRAM enables the system configuration to be simplified and consumes only a small amount of electric power. Because of this, the SRAM is suitably used as a memory for portable devices such as portable telephones.

There has been a demand for miniaturization of portable devices. To deal with this demand, the size of an SRAM section in which a memory cell array of the SRAM is formed must be reduced.

SUMMARY OF THE INVENTION

An objective of the present invention is to provide a semiconductor device which can be reduced in size.

(1) According to the present invention, there is provided a semiconductor device provided with an SRAM section which includes a plurality of memory cells, wherein:

each of the memory cells comprises a first well of a primary conductivity type, a second well of a secondary conductivity type, a first load transistor, a second load transistor, a first driver transistor, a second driver transistor, a first access transistor, and a second access transistor;

the first and second load transistors are located on the first well;

the first and second driver transistors and the first and second access transistors are located on the second well;

the semiconductor device comprises a third well of the primary conductivity type;

a bottom section of the third well is located at a position deeper than bottom sections of the first and second wells; and the third well is connected to the first well in each of the memory cells.

In the case of forming an interconnect for supplying a potential to the first well in which the load transistors are disposed on the semiconductor substrate, a well contact region in which the interconnect is connected to the first well must be formed on a semiconductor substrate. This hinders miniaturization of the SRAM section. According to the present invention, the third well becomes an interconnect for connecting the first well. This enables the SRAM section to be miniaturized.

Since the third well is disposed over the entire area of the memory cell region in the SRAM section, the well resistance of the first well can be decreased. Therefore, according to the present invention, occurrence of the latchup caused by an increase in the well resistance can be prevented.

According to the present invention, the third well of the primary conductivity type can be disposed under the second well of the secondary conductivity type in the form of a buried layer. A reverse biased pn junction is formed between the second well and the third well. A reverse biased pn junction is also formed between the second well and drains (for example, drain diffusion region of driver transistor) formed on the second well. In the case where a depletion layer in the pn junction is distorted due to funneling when α-rays are incident on the drain on the second well, the third well functions as a guard band. Specifically, the amount of funneling charge flowing into the drains on the second well can be limited to the extent of the depth of the second well. Therefore, in the present invention, occurrence of soft errors due to α-rays can be prevented.

(2) The semiconductor device of the present invention may further comprise a semiconductor circuit section, wherein:

the semiconductor circuit section comprises a fourth well of the primary conductivity type; and the fourth well is connected to the third well.

According to this configuration, a potential can be supplied to the first well from the fourth well through the third well.

(3) In the semiconductor device of the present invention, the SRAM section may have no well contact region in the third well.

According to this configuration, the SRAM section can be miniaturized.

(4) In the semiconductor device of the present invention, the SRAM section may have a well contact region in the third well.

According to this configuration, the well resistance of the first well can be decreased. In particular, substrate current generated in the fourth well can be prevented from flowing into the memory cell region by disposing the well contact region at the boundary between the fourth well and the third well. This further improves latchup withstand capacity.

(5) In the semiconductor device of the present invention, the SRAM section may include a normal memory cell group and a redundant memory cell group; and the normal memory cell group may be able to be replaced by the redundant memory cell group.

According to this configuration, the yield of the SRAM section can be improved.

(6) In the semiconductor device of the present invention, each of the memory cells may have a power supply line for a cell;

the power supply line for a cell may supply a potential to the first and second load transistors in each of the memory cells;

the power supply line for a cell may be electrically isolated from the third well;

each of the normal and redundant memory cell groups may have a power supply line for a memory cell group;

the power supply line for a memory cell group may supply a potential to the power supply lines for a cell in each of the normal and redundant memory cell groups;

the power supply line for a memory cell group may include a power supply disconnecting circuit; and the power supply line for a cell may be able to be disconnected from a power supply by the power supply disconnecting circuit.

According to this configuration, the power supply disconnecting circuit is provided to the power supply line for a memory cell group. Therefore, in the case where abnormal current flows into a certain memory cell through the power supply line for a memory cell group and the power supply line for a cell, the following countermeasures can be taken. The memory cell group including such a defective memory cell is replaced by the redundant memory cell group. The power supply line for a cell in the memory cell group including the defective memory cell is disconnected from the power supply by the power supply disconnecting circuit. This prevents current from flowing into the defective memory cell through the power supply line for a memory cell group and the power supply line for a cell. Therefore, it is possible to reduce the current defects in the memory cell, whereby the yield can be improved.

Moreover, the power supply line for a cell is disconnected from the power supply by using a memory cell group as one unit. Therefore, the area of the SRAM section can be decreased in comparison with the case of using the power supply line for a cell as one unit.

In addition, since the third well is isolated from the power supply line for a cell, current flowing into the defective memory cell through the third well can be prevented. Therefore, it is possible to reduce the current defects by only disconnecting the power supply line for a cell.

(7) In the semiconductor device of the present invention,
  the power supply line for a memory cell group may supply a potential to a bit-line precharge circuit for each of the memory cells; and
  the bit-line precharge circuit may be able to be disconnected from a power supply by the power supply disconnecting circuit.

According to this configuration, the bit line precharge circuit is connected to the power supply line for a memory cell group. Therefore, in the case where abnormal current flows into a certain memory cell through the bit line precharge circuit, the following countermeasures can be taken. The memory cell group including such a defective memory cell is replaced by the redundant memory cell group. The bit line precharge circuit is disconnected from the power supply. This prevents current from flowing into the defective memory cell through the bit line precharge circuit. Therefore, it is possible to reduce the current defects through the bit line, whereby the yield can be improved.

(8) In the semiconductor device of the present invention,
  the plurality of memory cells may make up a memory cell array; and
  each of the normal and redundant memory cell groups may include a plurality of columns of the memory cells in the memory cell array.

According to this configuration, the power supply for a memory cell can be shared by a plurality of columns. This prevents an increase in the area of the semiconductor device.

(9) In the semiconductor device of the present invention,
  each of the memory cells may have first and second gate-gate electrode layers, first and second drain-drain connecting layers, and first and second drain-gate connecting layers;
  the first gate-gate electrode layer may include gate electrodes of the first load transistor and the first driver transistor;
  the second gate-gate electrode layer may include gate electrodes of the second load transistor and the second driver transistor;
  the first drain-drain connecting layer may connect a drain of the first load transistor with a drain of the first driver transistor;
  the second drain-drain connecting layer may connect a drain of the second load transistor with a drain of the second driver transistor;
  the first and second gate-gate electrode layers may be located between the first and second drain-drain connecting layers;
  the first drain-gate connecting layer may connect the first drain-drain connecting layer with the second gate-gate electrode layer;
  the second drain-gate connecting layer may connect the second drain-drain connecting layer with the first gate-gate electrode layer; and
  each of the drain-gate connecting layers, the drain-drain connecting layers, and the gate-gate electrode layers may be located in different layers.

According to this configuration, a flip-flop is formed by using three types of layers (gate-gate electrode layer, drain-drain connecting layer, and drain-gate connecting layer) Therefore, the pattern of each layer can be simplified (linear pattern, for example) in comparison with the case of forming a flip-flop by using two types of layers. Since the pattern of each layer can be simplified, a minute semiconductor device with a memory cell size of 4.5 $\mu m^2$ or less, for example, can be fabricated.

(10) In the semiconductor device of the present invention,
  the primary conductivity type may be an n-type;
  the secondary conductivity type may be a p-type;
  a $V_{DD}$ power supply may be connected to the first and third wells; and
  a $V_{SS}$ power supply may be connected to the second well.

(11) In the semiconductor device of the present invention,
  a well contact region may be provided for every two memory cells in the second well.

According to this configuration, occurrence of latchup can be prevented. The substrate resistance is increased in a memory cell apart from the well contact region. An increase in the substrate resistance causes latchup to occur. According to the present invention, the well contact region of the second well is formed for every two memory cells. Therefore, since the second well is located close to the well contact region, the substrate resistance can be decreased. As a result, occurrence of latchup can be prevented.

DETAILED DESCRIPTION OF THE EMBODIMENT

Figure 18:
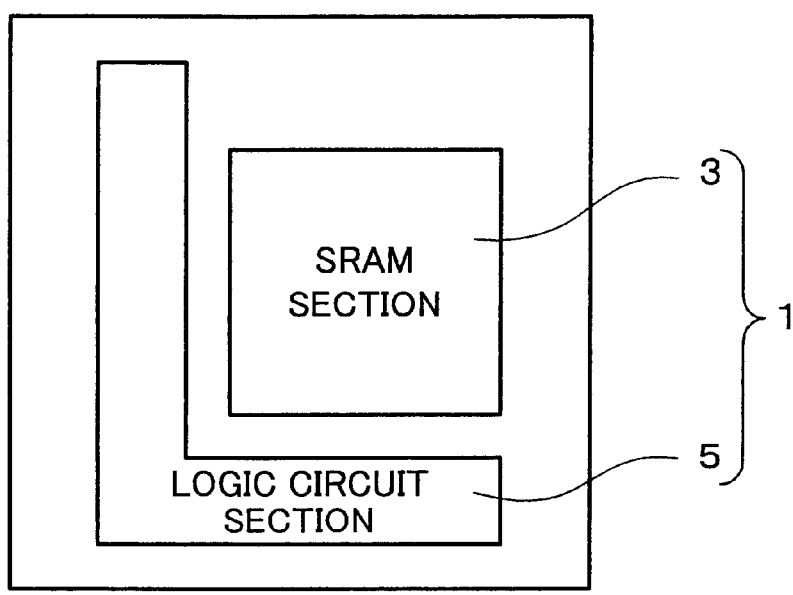
FIG. 18 is a plan view showing a semiconductor device according to the embodiment.

An embodiment of a semiconductor device according to the present invention is described below. FIG. 18 is a plan view showing a semiconductor device 1 of to the embodiment. In the semiconductor device 1, an SRAM section 3 and a logic circuit section 5 are formed on a single semiconductor substrate. The logic circuit section 5 may be an SRAM peripheral circuit such as a decoder, a sense amplifier, or a control circuit. The logic circuit section 5 may be a logic circuit of an embedded memory chip other than a memory. The semiconductor device 1 is described below in the order of an outline of the SRAM section 3, details of the SRAM section 3, the logic circuit section 5, wells of the semiconductor device 1, and a redundant circuit in the SRAM section 3.

1. Outline of SRAM Section 3

The SRAM section 3 of the present embodiment is a type of memory in which one memory cell is formed by six MOS field effect transistors. The outline of the SRAM section 3 is described below separately for the structure of a section which forms a flip-flop of the memory cell, the structure of the memory cell, and the major effects of the SRAM section 3.

1.1 Structure of Section Which Forms Flip-flop of Memory Cell

Figure 1:
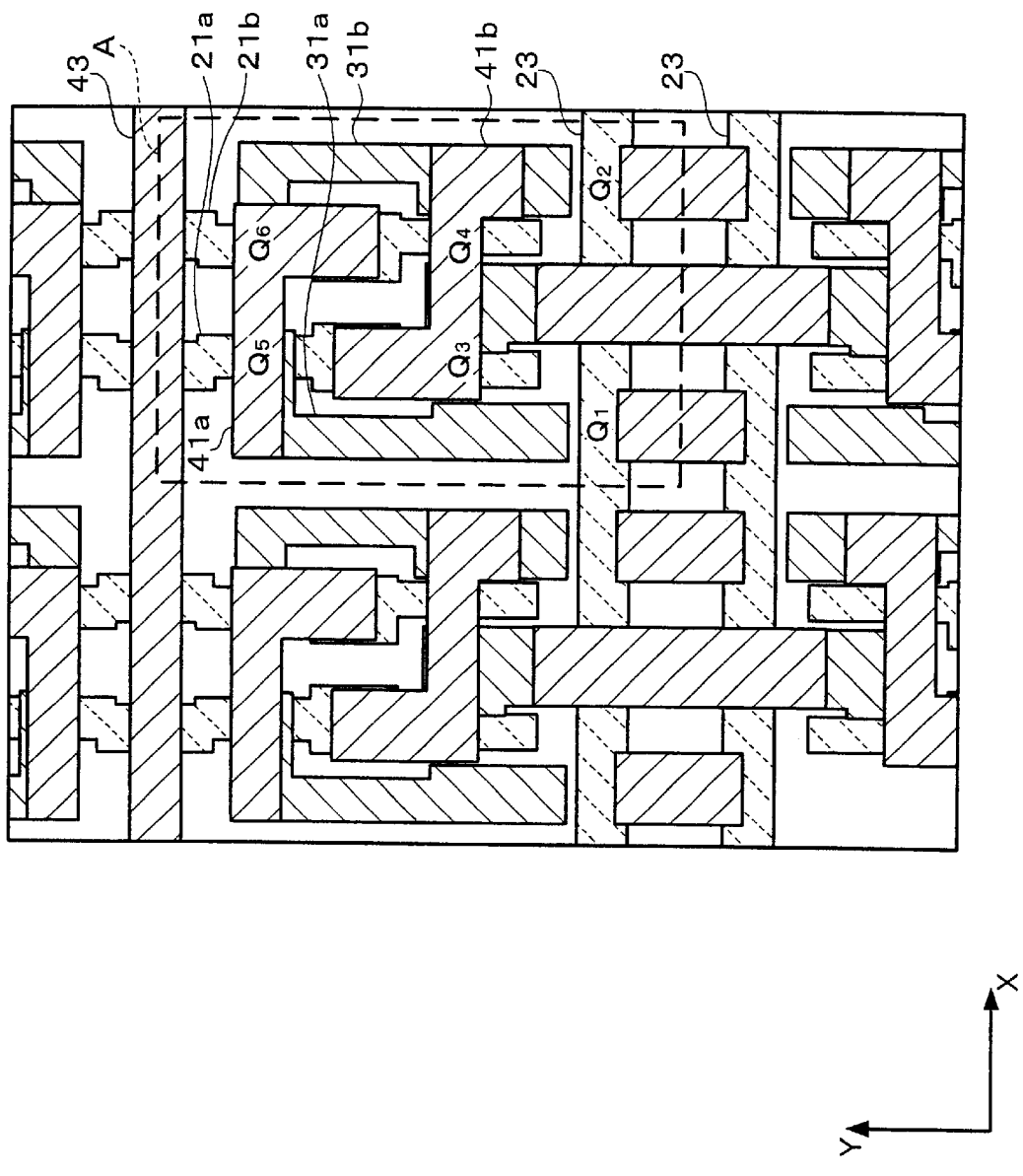
FIG. 1 is a plan view showing a first conductive layer, a second conductive layer, and a third conductive layer in part of a memory cell array of an SRAM section according to an embodiment of the present invention.

FIG. 1 is a plan view showing a first conductive layer, a second conductive layer, and a third conductive layer in part of a memory cell array of the SRAM section 3 of the present embodiment. The first conductive layer, the second conductive layer, and the third conductive layer are individually described below so as to ensure that FIG. 1 is readily understood.

Figure 3:
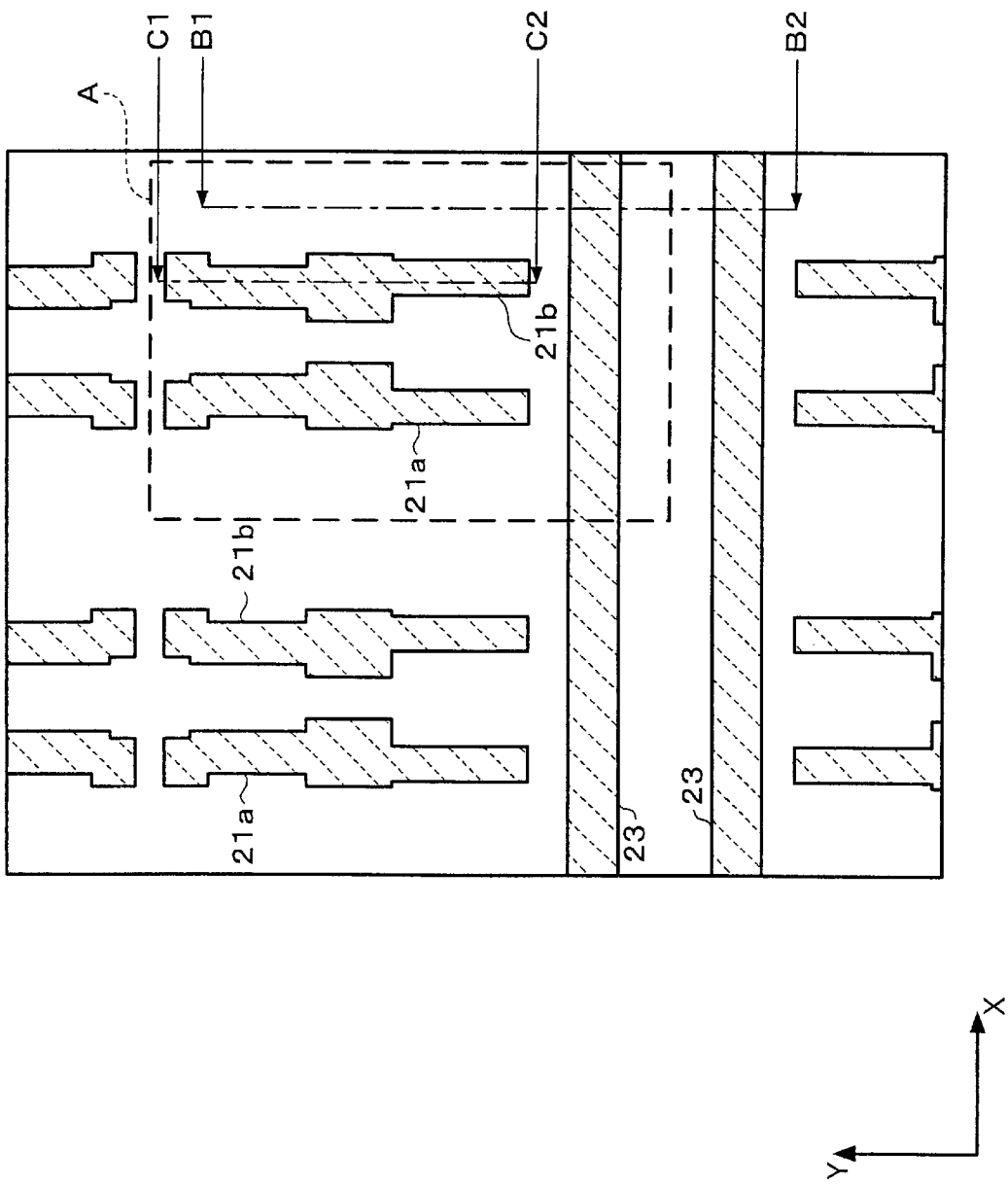
FIG. 3 is a plan view showing the first conductive layer in part of the memory cell array of the SRAM section according to the embodiment.
Figure 5:
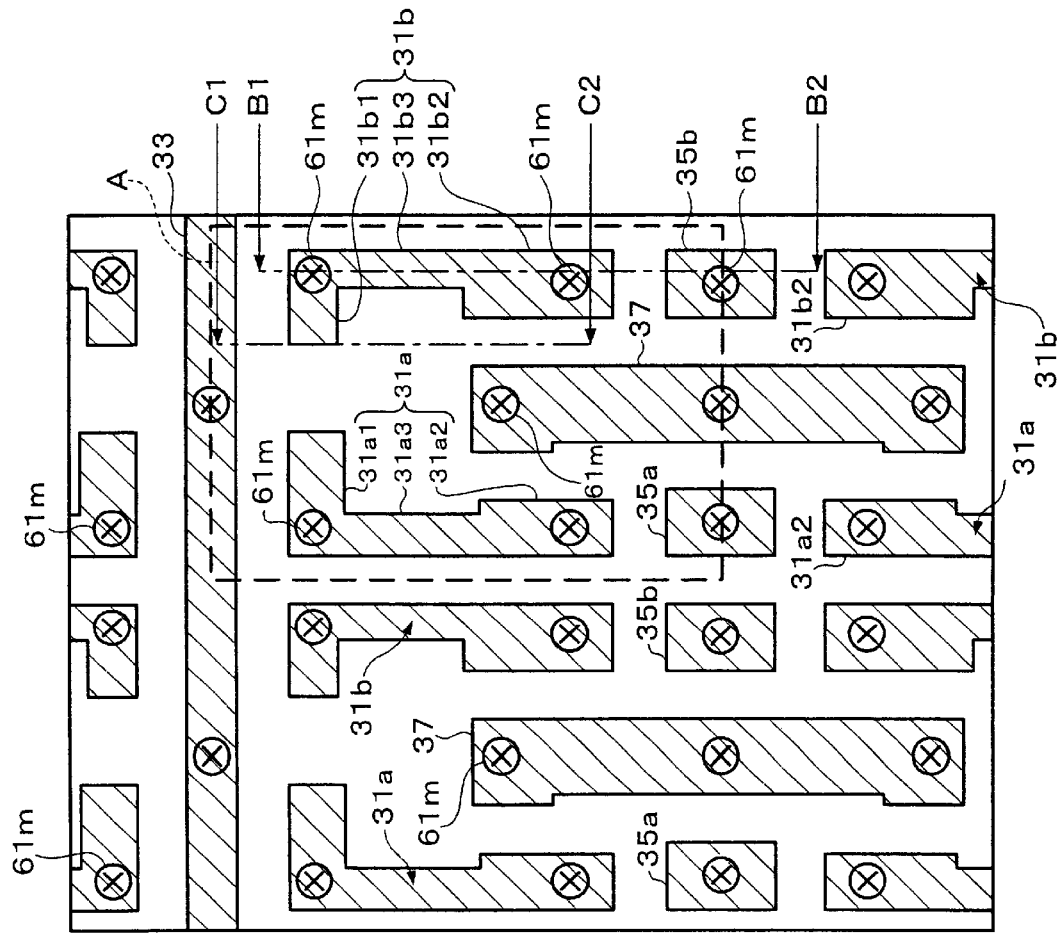
FIG. 5 is a plan view showing the second conductive layer in part of the memory cell array of the SRAM section according to the embodiment.
Figure 8:
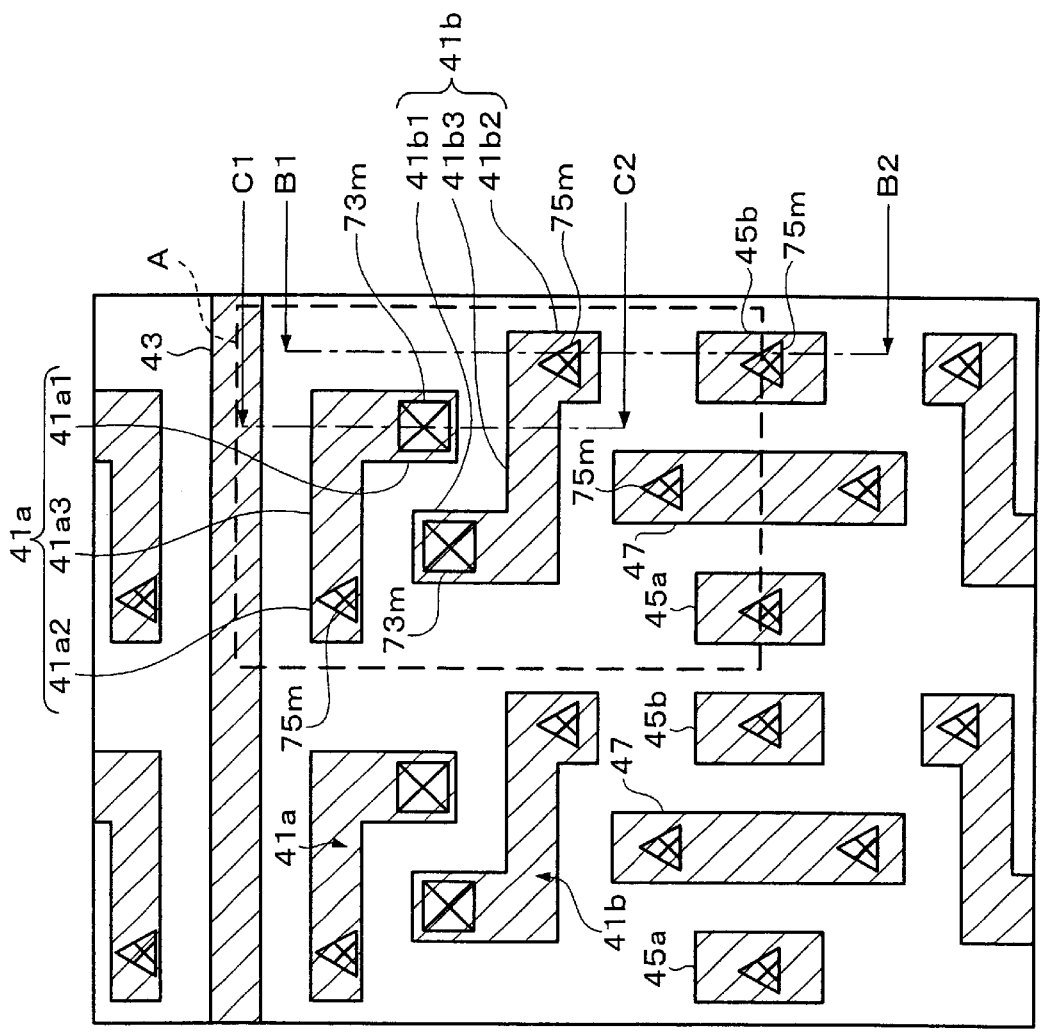
FIG. 8 is a plan view showing the third conductive layer in part of the memory cell array of the SRAM section according to the embodiment.

Gate electrode layers 21a and 21b and sub-word lines 23 are disposed in the first conductive layer, as shown in FIG. 3. Drain-drain connecting layers 31a and 31b and the like are disposed in the second conductive layer, as shown in FIG. 5. Drain-gate connecting layers 41a and 41b and the like are disposed in the third conductive layer, as shown in FIG. 8. The structure shown in FIG. 5 is positioned on the structure shown in FIG. 3. The structure shown in FIG. 8 is positioned on the structure shown in FIG. 5. FIG. 1 shows these structures collectively.

FIG. 1 shows a section which forms a flip-flop. This section is described below focusing on a region A. One memory cell is formed in the region A. The region A shown in other figures has the same meaning.

Figure 17:
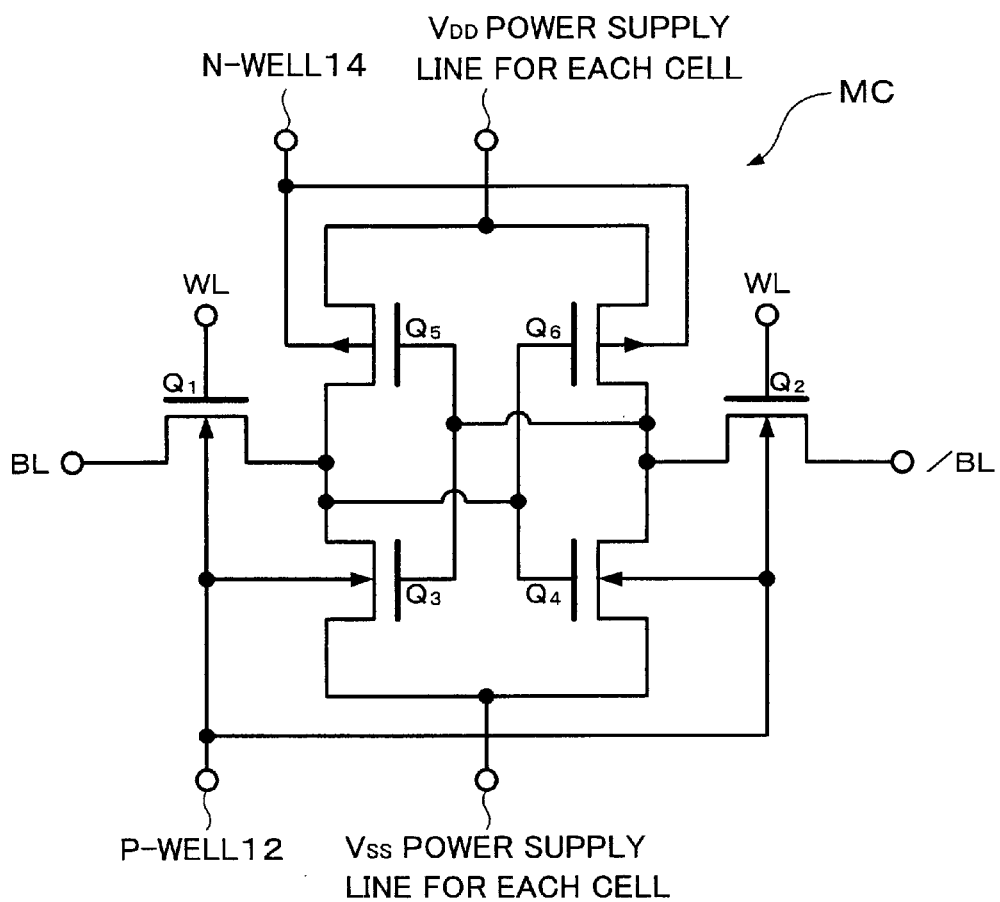
FIG. 17 shows an equivalent circuit of the SRAM according to the embodiment.

In the region A, six MOS field effect transistors including n-channel access transistors $Q_1$ and $Q_2$, n-channel driver transistors $Q_3$ and $Q_4$, and p-channel load transistors $Q_5$ and $Q_6$ are formed. The driver transistor $Q_3$ and the load transistor $Q_5$ make up one CMOS inverter. The driver transistor $Q_4$ and the load transistor $Q_6$ make up one CMOS inverter. A flip-flop is formed by cross-coupling these two CMOS inverters. FIG. 17 shows an equivalent circuit of a circuit formed by the six MOS field effect transistors in the region A.

The gate-gate electrode layers 21a and 21b respectively have a linear pattern, as shown in FIG. 1. The gate-gate electrode layer 21a forms gate electrodes of the driver transistor $Q_3$ and the load transistor $Q_5$, and connects these gate electrodes. The gate-gate electrode layer 21b forms gate electrodes of the driver transistor $Q_4$ and the load transistor $Q_6$, and connects these gate electrodes.

A drain region of the driver transistor $Q_3$ and a drain region of the load transistor $Q_5$ are connected through the drain-drain connecting layer 31a. A drain region of the driver transistor $Q_4$ and a drain region of the load transistor $Q_6$ are connected through the drain-drain connecting layer 31b. The drain-drain connecting layers 31a and 31b respectively have a linear pattern.

The gate electrodes (gate-gate electrode layer 21a) of the driver transistor $Q_3$ and the load transistor $Q_5$ are connected to the drain-drain connecting layer 31b through the drain-gate connecting layer 41b. The gate electrodes (gate-gate electrode layer 21b) of the driver transistor $Q_4$ and the load transistor $Q_6$ are connected to the drain-drain connecting layer 31a through the drain-gate connecting layer 41a. The drain-gate connecting layers 41a and 41b respectively have a pattern in the shape of the letter "L". The angle formed by a first side and a second side of the L-shaped pattern is approximately 90°. The first side of the drain-gate connecting layer 41a faces the first side of the drain-gate connecting layer 41b. The second side of the drain-gate connecting layer 41a faces the second side of the drain-gate connecting layer 41b. The drain-gate connecting layer 41a and the drain-gate connecting layer 41b are approximately point-symmetrical.

The gate-gate electrode layer 21a, the gate-gate electrode layer 21b, the drain-drain connecting layer 31a, and the drain-drain connecting layer 31b are disposed in parallel. In a plan view, the gate electrode layers 21a and 21b are located between the drain-drain connecting layers 31a and 31b.

1.2 Structure of Memory Cell

Figure 2:
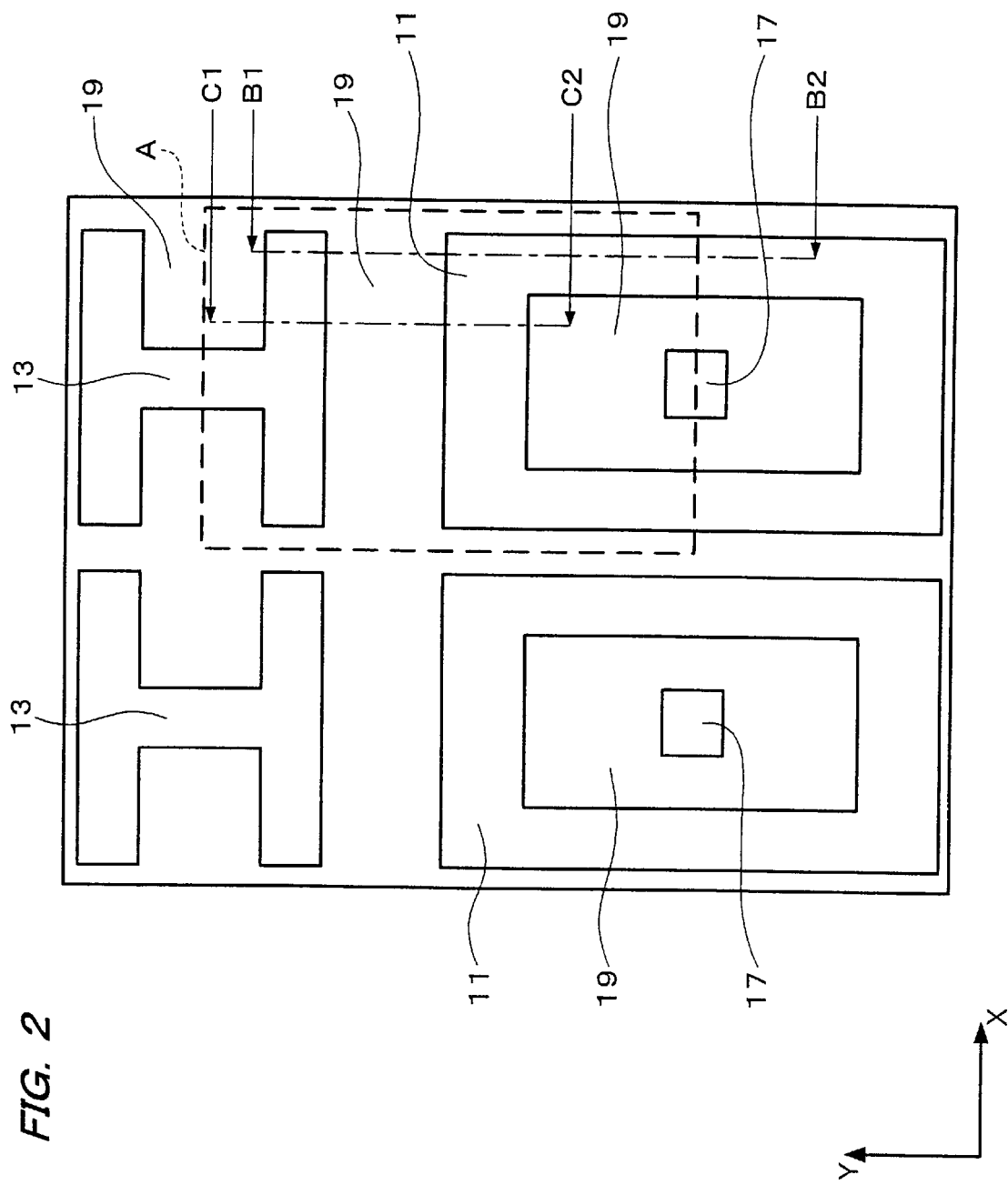
FIG. 2 is a plan view showing a field in part of the memory cell array of the SRAM section according to the embodiment.
Figure 10:
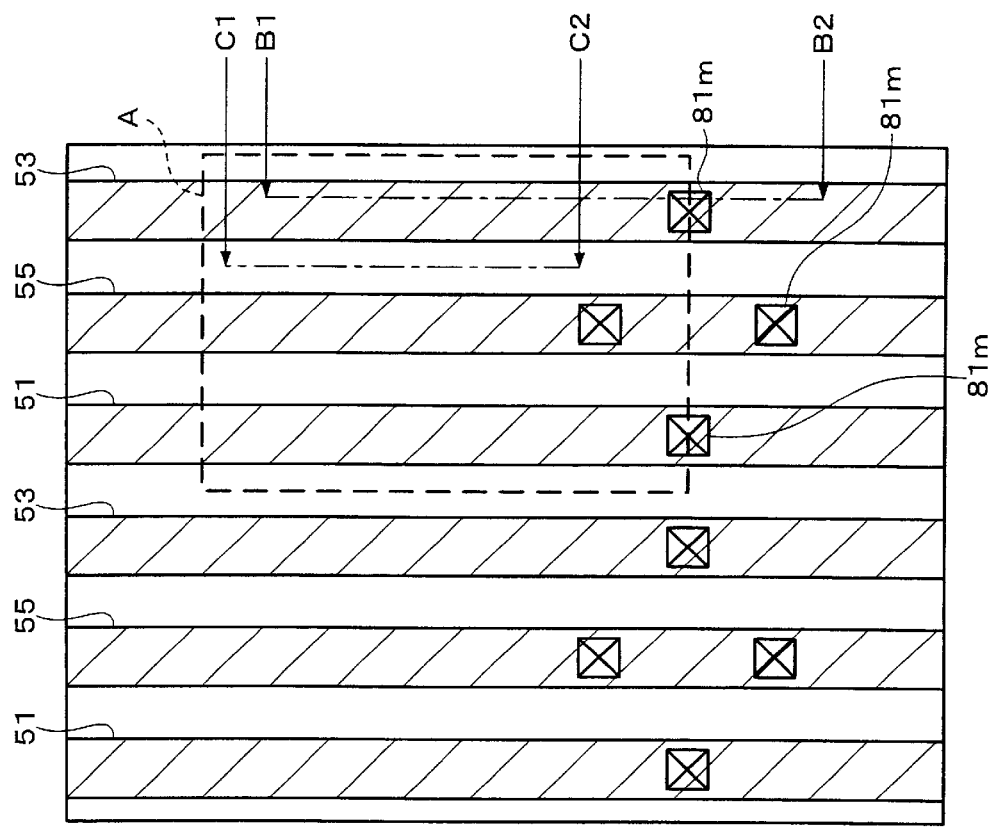
FIG. 10 is a plan view showing the fourth conductive layer in part of the memory cell array of the SRAM section according to the embodiment.

The structure of the memory cell in the SRAM section 3 of the present embodiment is described below. The memory cell in the SRAM section 3 has a structure in which the first conductive layer, the second conductive layer, the third conductive layer, and a fourth conductive layer are layered in that order on a field through interlayer dielectrics. The field is a region in which active regions 11, 13, and 17 and element isolation regions 19 are located, as shown in FIG. 2. Bit lines 51 and the like are formed in the fourth conductive layer, as shown in FIG. 10. In the memory cell of the SRAM section 3, the first conductive layer, the second conductive layer, and the third conductive layer shown in FIG. 1 are located on the field shown in FIG. 2. The fourth conductive layer shown in FIG. 10 is located above the third conductive layer.

1.3 Major Effects of SRAM Section 3

According to the present embodiment, the memory cell size in the SRAM section can be decreased. In the present embodiment, information is stored using a flip-flop of the memory cell. A flip-flop is formed by connecting an input terminal (gate electrode) of one inverter to an output terminal (drain) of another inverter, and connecting an input terminal (gate electrode) of the latter inverter to an output terminal (drain) of the former inverter. Specifically, the flip-flop is formed by cross-coupling a first inverter and a second inverter. In the case of forming a flip-flop using two layers, the inverters can be cross-coupled by forming a drain-drain connecting layer for connecting the drains of the inverters and a drain-gate connecting layer for connecting the gate and the drain of the inverters in one conductive layer.

According to this structure, this conductive layer is formed across a region in which the drain of one inverter is located, a region in which the gate of the other inverter is located, and a region for connecting these regions. Therefore, this conductive layer has a pattern with three ends (pattern having a branched portion in the shape of the letter "T" or "h", for example), or a spiral pattern in which the arms are intricate. For example, a pattern in the shape of the letter "T" is disclosed by Japanese Patent Application Laid-open No. 10-41409 in FIG. 1. A pattern with a branched portion in the shape of the letter "h" is disclosed by M. Ishida, et. al. in *IEDM Tech. Digest*, 1998, page 203, FIG. 4(b). A spiral pattern is disclosed by M. Ishida, et. al. in *IEDM Tech. Digest*, 1998, page 203, FIG. 3(b), for example. These complicated patterns make it difficult to accurately reproduce the shape of a pattern in a photoetching step as the pattern becomes minute, whereby a desired pattern cannot be obtained. This hinders miniaturization of the memory cell size.

According to the present embodiment, as shown in FIG. 1, the gate-gate electrode layers (21a, 21b) which become the gates of the CMOS inverters, the drain-drain connecting layers (31a, 31b) for connecting the drains of the CMOS inverters, and the drain-gate connecting layers (41a, 41b) for connecting the gate of one CMOS inverter to the drain of the other CMOS inverter are respectively formed in different layers. Therefore, a flip-flop is formed using three layers. This enables the pattern of each layer to be simplified (linearly, for example) in comparison with a case of forming a flip-flop using two layers. According to the present embodiment, since the pattern of each layer can be simplified in this manner, an SRAM of the 0.18 μm generation with a memory cell size of 4.5 μm² or less can be fabricated, for example.

2. Details of SRAM Section 3

Figure 13:
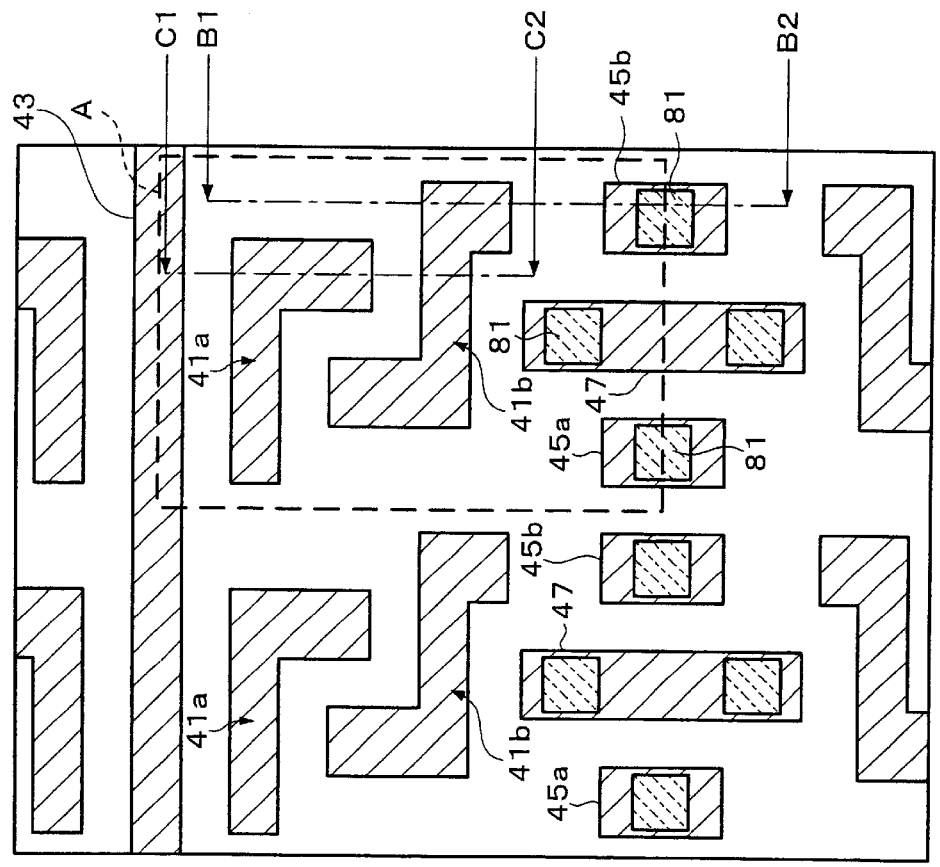
FIG. 13 is a plan view showing the third conductive layer and the contact-conductive section 81 in the SRAM section according to the embodiment.
Figure 14:
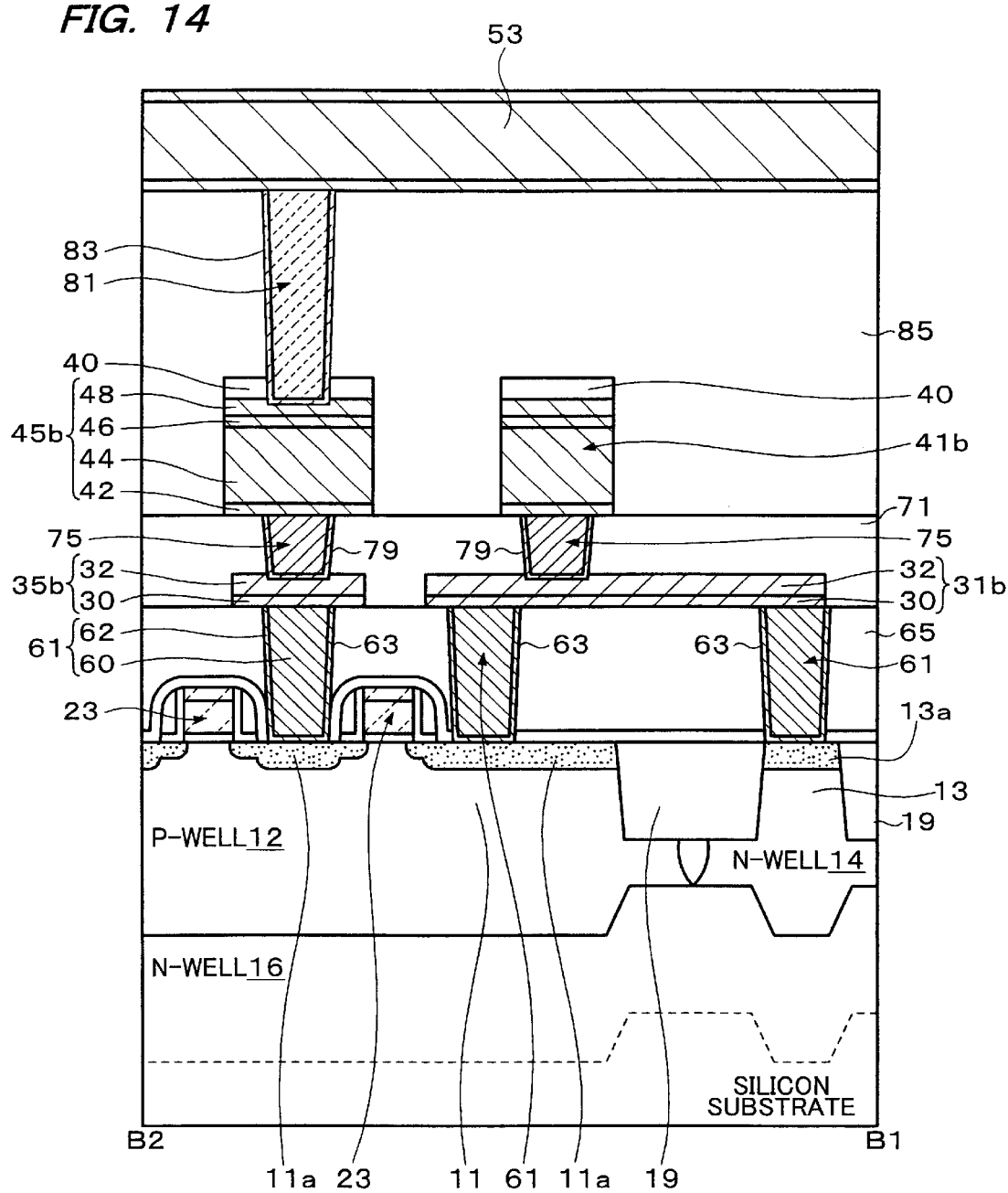
FIG. 14 is a cross-sectional view of the SRAM section according to the embodiment taken along the line B1–B2 of FIGS. 2 to 13.
Figure 15:
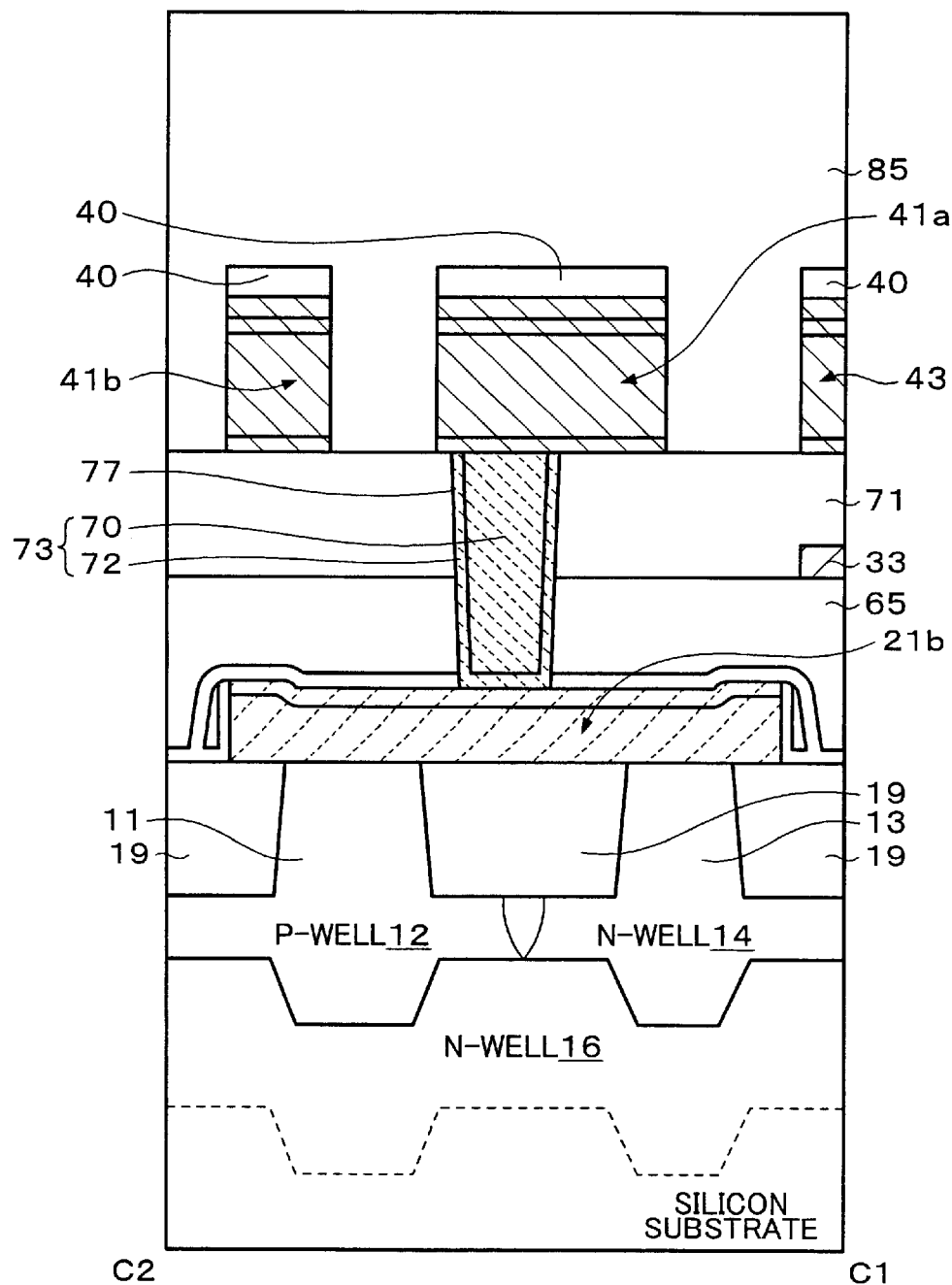
FIG. 15 is a cross-sectional view of the SRAM section according to the embodiment taken along the line C1–C2 of FIGS. 2 to 13.

The details of the SRAM section 3 are described below with reference to FIGS. 2 to 15 in the order from the lower layers. A line B1–B2 and a line C1–C2 are drawn in FIGS. 2 to 13. FIG. 14 is a view showing the cross section along the line B1–B2. FIG. 15 is a view showing the cross section along the line C1–C2.

2.1 Field and First Conductive Layer

Figure 11:
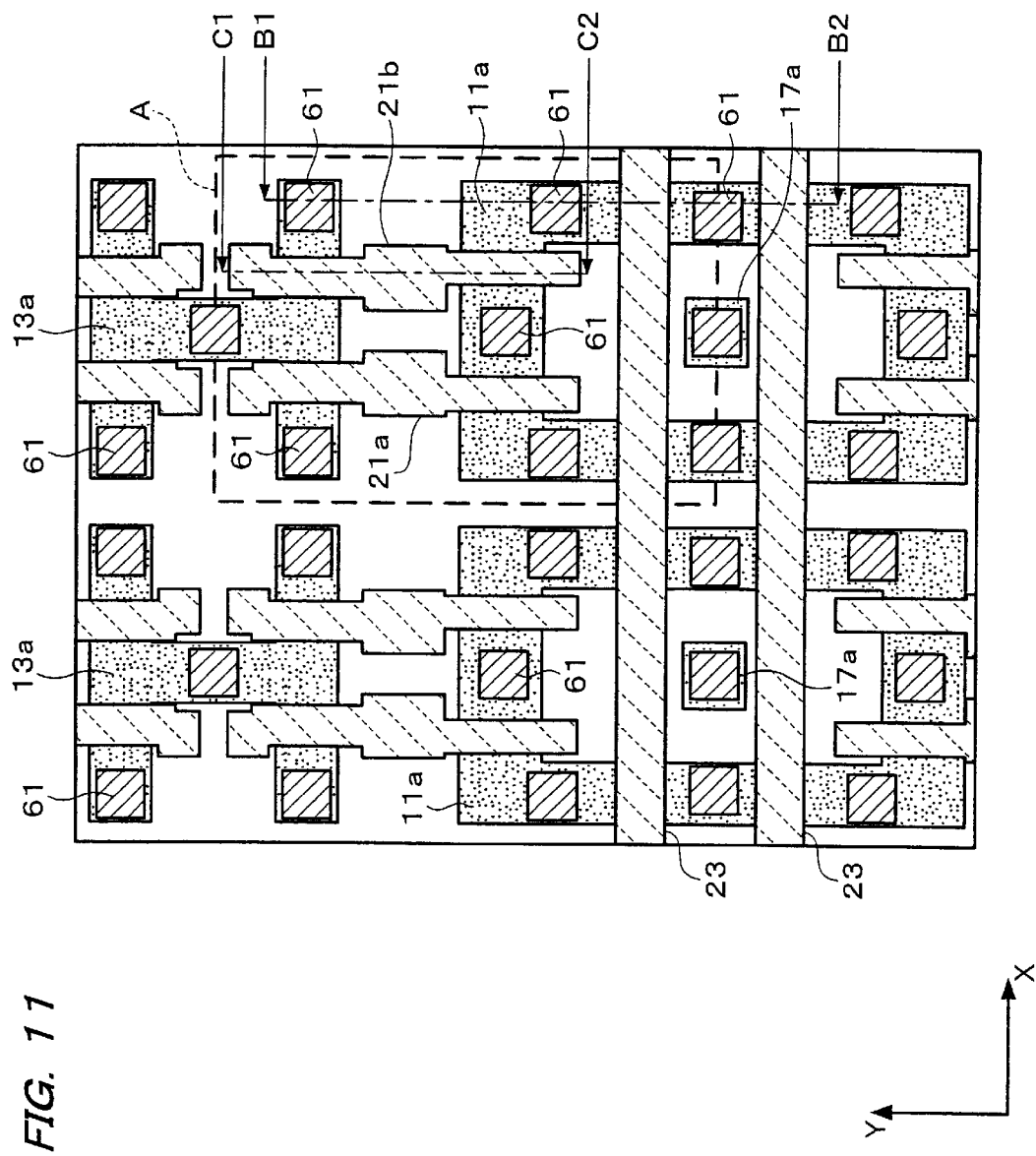
FIG. 11 is a plan view showing the field, first conductive layer, and contact-conductive section 61 in the SRAM section according to the embodiment.

FIG. 11 is a plan view showing the field and the first conductive layer. First, the field is described with reference to FIGS. 2, 14, and 15. FIG. 2 is a plan view showing the field. The field includes the active regions 11, 13, and 17 and the element isolation regions 19. The active regions 11, 13, and 17 are formed on the surface of a silicon substrate.

The active regions 11 have a rectangular shape with a rectangular opening formed therein. In FIG. 2, a plurality of active regions 11 is arranged in the X-axis direction. The access transistors $Q_1$ and $Q_2$ and the driver transistors $Q_3$ and $Q_4$ shown in FIG. 1 are formed in the active region 11.

The active regions 13 resemble the letter "H" in shape. In FIG. 2, a plurality of active regions 13 is arranged in the X-axis direction. The load transistors $Q_5$ and $Q_6$ shown in FIG. 1 are formed in the active region 13.

The active regions 17 are formed in every two memory cells arranged in the Y-axis direction. A well contact region for a p-well is formed in the active region 17. Therefore, a p-well corresponding to two memory cells is connected to a $V_{SS}$ interconnect (ground line) through the well contact region.

The active regions 11, 13, and 17 are isolated from one another by the element isolation regions 19 (depth: 400 nm, for example). The element isolation regions 19 are formed by Shallow Trench Isolation (STI), for example.

The cross sections of the field along the line B1–B2 and the line C1–C2 shown in FIG. 2 are respectively shown in FIGS. 14 and 15. A p-well 12, an n-well 14, and an n-well 16 formed in the silicon substrate are illustrated in these cross sections. These wells are described later in "4. Wells of semiconductor device 1".

The first conductive layer located on the field is described below with reference to FIGS. 3, 11, 14, and 15. FIG. 3 is a plan view showing the first conductive layer. A plurality of gate-gate electrode layers 21a and 21b and a plurality of sub-word lines 23 are disposed in the first conductive layer. The gate-gate electrode layers 21a and 21b and the sub-word lines 23 have a structure in which a silicide layer is formed on a polysilicon layer, for example.

The gate-gate electrode layers 21a and 21b respectively have a linear pattern extending in the Y-axis direction shown in FIG. 3. A pair of gate-gate electrode layers 21a and 21b is disposed in parallel in one memory cell region. The gate-gate electrode layers 21a and 21b become the gate electrodes of the driver transistors $Q_3$ and $Q_4$ and the load transistors $Q_5$ and $Q_6$ shown in FIG. 1. The gate length of the driver transistors $Q_3$ and $Q_4$ is 0.18 μm, for example. The gate length of the load transistors $Q_5$ and $Q_6$ is 0.20 μm, for example.

The sub-word lines 23 have a linear pattern extending in the X-axis direction shown in FIG. 3. The sub-word lines 23 are located on the side of the driver transistors. The sub-word lines 23 are activated or deactivated by a main-word line located in the upper layer. The sub-word lines 23 become the gate electrodes of the access transistors. The gate length of the access transistors is 0.24 μm, for example.

The cross sections of the first conductive layer along the line B1–B2 and the line C1–C2 shown in FIG. 3 are respectively shown in FIGS. 14 and 15. The sub-word lines 23 and the gate-gate electrode layer 21b are illustrated in these cross sections.

Source/drain regions and the like formed in the active regions are described below. An n⁺-type source/drain region 11a is formed in the active region 11, as shown in FIG. 11. The source/drain region functions as at least either the source or drain. A p⁺-type well contact region 17a is formed in the active region 17.

An interlayer dielectric 65 (not shown in FIG. 11) such as a silicon oxide layer is formed so as to cover the field and the first conductive layer. The interlayer dielectric 65 is planarized by CMP, as shown in FIGS. 14 and 15. A plurality of contact holes 63 for exposing the n⁺-type source/drain regions 11a and the like is formed in the interlayer dielectric 65. These contact holes 63 are filled with contact-conductive sections 61.

The contact-conductive section 61 includes a plug 60 buried in the contact hole 63 and a high-melting-point metal nitride layer 62 located on the bottom and the side of the contact hole 63. As a material for the plug 60, tungsten and the like can be used. As a material for the high-melting-point metal nitride layer 62, titanium nitride and the like can be used. The high-melting-point metal nitride layer 62 mainly functions as a barrier layer. The upper end diameter of the contact hole 63 is 0.30 $\mu$m, for example. The lower end diameter of the contact hole 63 is 0.24 $\mu$m, for example.

Figure 4:
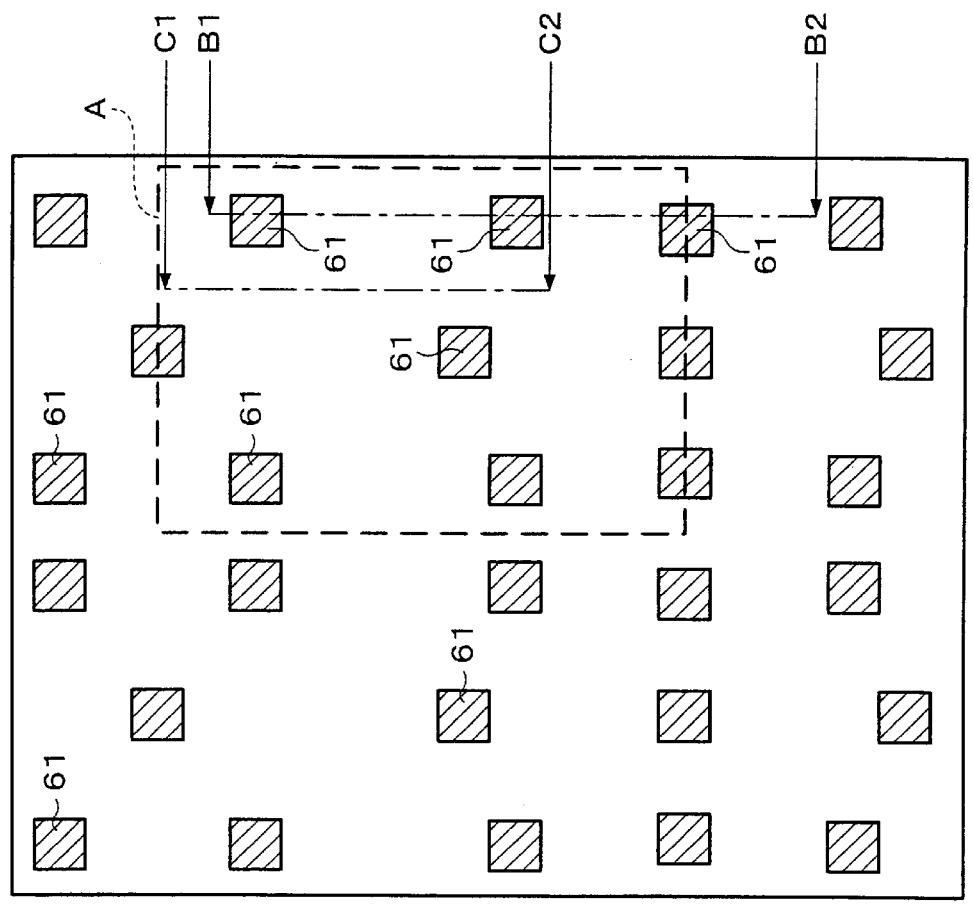
FIG. 4 is a plan view showing a contact-conductive section 61 in part of the memory cell array of the SRAM section according to the embodiment.

FIG. 4 is a plan view showing the pattern of the contact-conductive sections 61. The contact-conductive sections 61 are connected to the n⁺-type source/drain regions 11a, the p⁺-type source/drain regions 13a, and the p⁺-type well contact regions 17a, as shown in FIG. 11.

2.2 Second Conductive Layer

The second conductive layer is located on the structure shown in FIG. 11. As shown in FIG. 5, a plurality of drain-drain connecting layers 31a and 31b, a $V_{DD}$ interconnect 33, a plurality of BL (bit line, bit-bar line) contact pad layers 35a and 35b, and a plurality of $V_{SS}$ local interconnects 37 are disposed in the second conductive layer. For example, these layers and interconnects have a structure in which a high-melting-point metal nitride layer (thickness: 135 nm, for example) is formed on a high-melting-point metal layer (thickness: 8.5 nm, for example). The high-melting-point metal layer, which is an underlay, is formed of a titanium layer, for example. The high-melting-point metal nitride layer is a titanium nitride layer, for example. The second conductive layer may be formed only of a high-melting-point metal nitride layer.

First, the drain-drain connecting layers 31a and 31b are described. The drain-drain connecting layers 31a and 31b respectively have a linear pattern extending in the Y-axis direction shown in FIG. 5. The width of a body section 31a3 of the drain-drain connecting layer 31a is smaller than the width of end sections 31a1 and 31a2 of the drain-drain connecting layer 31a. The width of a body section 31b3 of the drain-drain connecting layer 31b is smaller than the width of end sections 31b1 and 31b2 of the drain-drain connecting layer 31b. The width of the body sections 31a3 and 31b3 is a minimum width in the design rule. A pair of drain-drain connecting layers 31a and 31b is disposed in one memory cell region.

The $V_{SS}$ local interconnects 37 have end sections and a body section extending in the Y-axis direction shown in FIG. 5. The width of the end sections of the $V_{SS}$ local interconnects 37 is greater than the width of the body section of the $V_{SS}$ local interconnects 37. The $V_{SS}$ local interconnect 37 is located between the end section 31a2 of the drain-drain connecting layer 31a and the end section 31b2 of the drain-drain connecting layer 31b. In FIG. 5, the $V_{SS}$ local interconnects 37 extend from this location to between the end section 31a2 of the drain-drain connecting layer 31a and the end section 31b2 of the drain-drain connecting layer 31b in the memory cell located below. One $V_{SS}$ local interconnect 37 is disposed across two memory cells.

The BL contact pad layers 35a function as pad layers for connecting the bit lines with the n⁺-type source/drain regions 11a (see FIG. 11). The BL contact pad layers 35b function as pad layers for connecting the bit-bar lines with the n⁺-type source/drain regions 11a.

The BL contact pad layers 35a are located between the drain-drain connecting layer 31a in one memory cell and the drain-drain connecting layer 31a in the memory cell located below, shown in FIG. 5. The BL contact pad layers 35b are located between the drain-drain connecting layer 31b in one memory cell and the drain-drain connecting layer 31b in the memory cell located below shown in FIG. 5. Each of the BL contact pad layers 35a and 35b is disposed across two memory cells.

The $V_{DD}$ interconnect 33 has a linear pattern extending in the X-axis direction shown in FIG. 5.

The drain-drain connecting layers 31a and 31b, the $V_{DD}$ interconnect 33, the BL contact pad layers 35a and 35b, and the $V_{SS}$ local interconnects 37 which are located in the second conductive layer shown in FIG. 5 are connected to the contact-conductive sections 61 shown in FIG. 11. These connections are indicated by contact sections 61m in FIG. 5.

The cross section of the second conductive layer shown in FIG. 5 along the line B1–B2 is shown in FIG. 14. The drain-drain connecting layer 31b and the BL contact pad layer 35b are illustrated in this cross section. The second conductive layer includes a high-melting-point metal layer 30 and a high-melting-point metal nitride layer 32 located on the high-melting-point metal layer 30, as described above.

Figure 12:
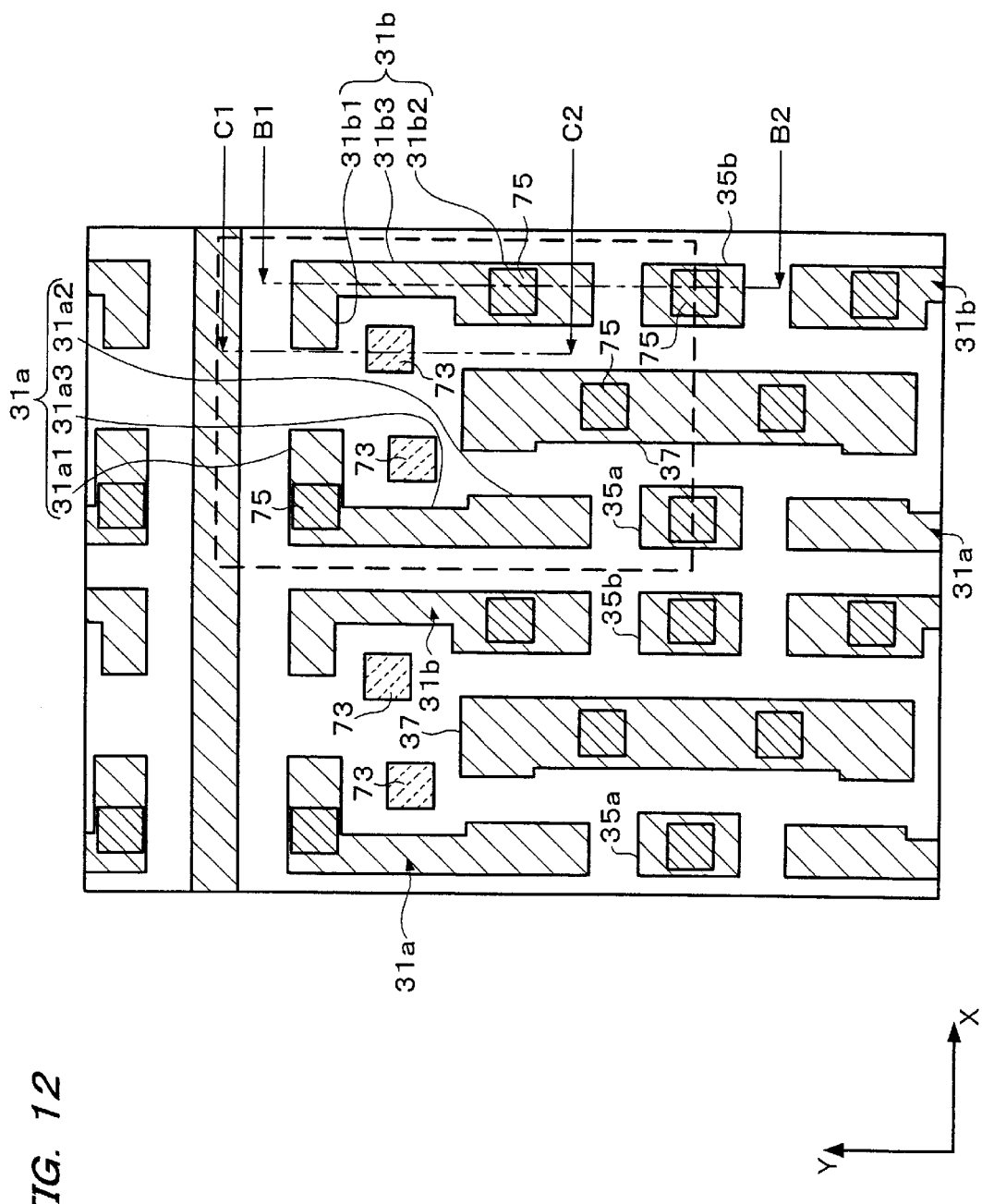
FIG. 12 is a plan view showing the second conductive layer and the contact-conductive sections 73 and 75 in the SRAM section according to the embodiment.

An interlayer dielectric 71 (not shown in FIG. 5) such as a silicon oxide layer is formed so as to cover the second conductive layer. The interlayer dielectric 71 is planarized by CMP, as shown in FIGS. 14 and 15. A plurality of through-holes 79 for exposing the drain-drain connecting layers 31b and the like is formed in the interlayer dielectric 71, as shown in FIG. 14. The through-holes 79 are filled with contact-conductive sections 75. A through-hole 77 for exposing the gate-gate electrode layer 21b is formed through the interlayer dielectrics 71 and 65, as shown in FIG. 15. The through-hole 77 is filled with a contact-conductive section 73. FIG. 12 shows a planar relation between the contact-conductive sections 73 and 75 and the second conductive layer.

Figure 6:
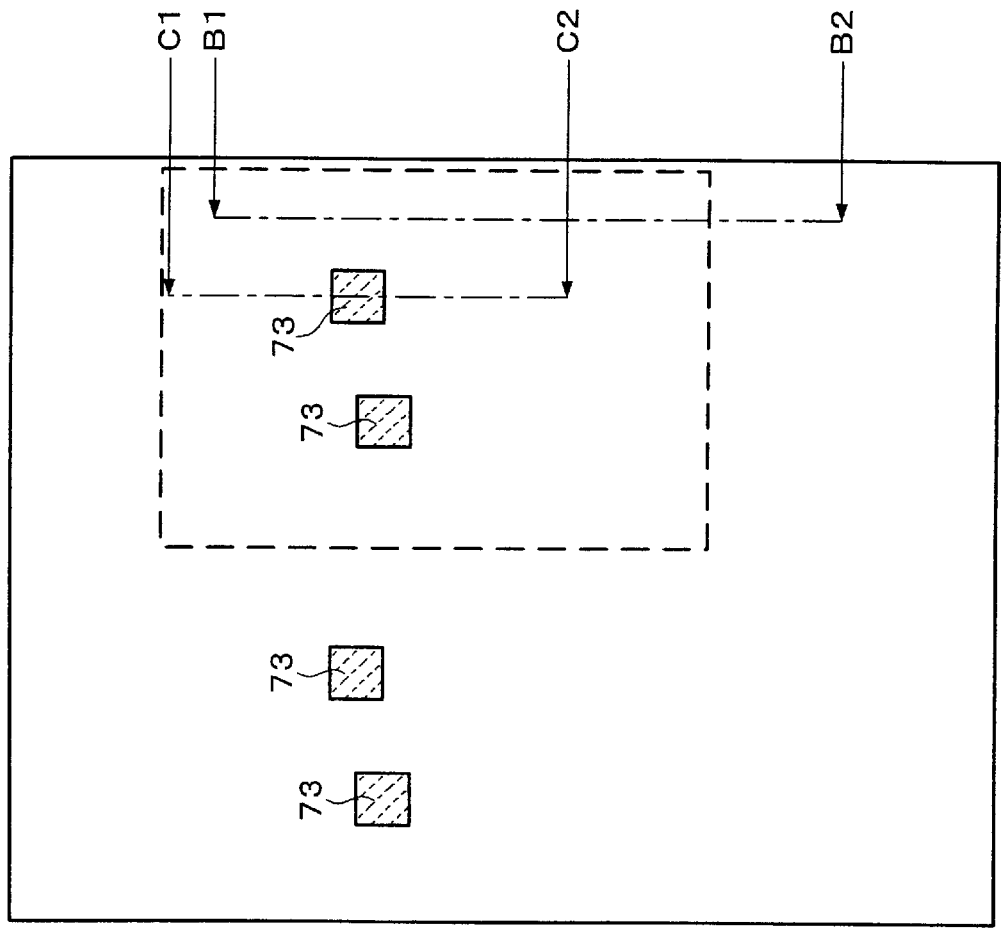
FIG. 6 is a plan view showing a contact-conductive section 73 in part of the memory cell array of the SRAM section according to the embodiment.

The contact-conductive section 73 is described below. FIG. 6 is a plan view showing the pattern of the contact-conductive sections 73. The contact-conductive sections 73 are connected to the gate-gate electrode layers 21a and 21b (see FIG. 3). The cross section of the contact-conductive sections 73 is described below with reference to FIG. 15. The contact-conductive sections 73 are buried in the through-holes 77 formed through the interlayer dielectrics 65 and 71. In this cross section, the contact-conductive section 73 is connected to the gate-gate electrode layer 21b. The contact-conductive section 73 includes a plug 70 buried in the through-hole 77 and a high-melting-point metal nitride layer 72 located on the bottom and the side of the through-hole 77. As a material for the plug 70, tungsten and the like can be used. As a material for the high-melting-point metal nitride layer 72, titanium nitride and the like can be used. The high-melting-point metal nitride layer 72 mainly functions as a barrier layer. The upper end diameter of the through-hole 77 is 0.32 $\mu$m, for example. The lower end diameter of the through-hole 77 is 0.24 $\mu$m, for example.

Figure 7:
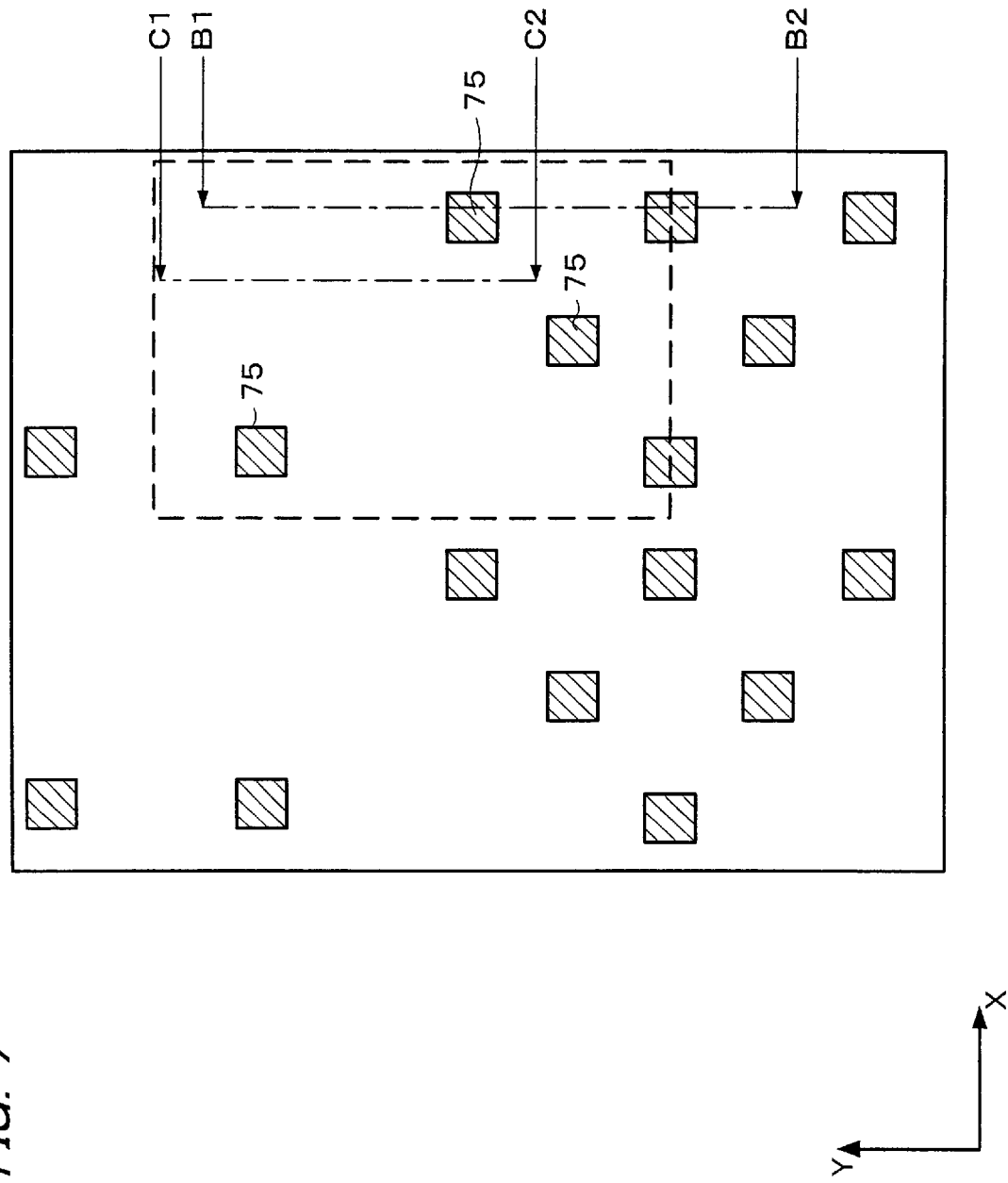
FIG. 7 is a plan view showing a contact-conductive section 75 in part of the memory cell array of the SRAM section according to the embodiment.

The contact-conductive section 75 is described below. FIG. 7 is a plan view showing the pattern of the contact-conductive sections 75. The contact-conductive sections 75 are connected to the end sections 31a1 of the drain-drain connecting layers 31a, the end sections 31b2 of the drain-drain connecting layers 31b, the BL contact pad layers 35a and 35b, and the $V_{SS}$ local interconnects 37, as shown in FIG. 12. The cross section of the contact-conductive section 75 is described below with reference to FIG. 14. The contact-conductive sections 75 are buried in the through-holes 79 formed through the interlayer dielectric 71. In this cross section, the contact-conductive sections 75 are connected to the drain-drain connecting layer 31b and the BL contact pad layer 35b. Components of the contact-conductive sections 75 are the same as those of the contact-conductive sections 61 and 73. The upper end diameter of the through-holes 79 is 0.30 $\mu$m, for example. The lower end diameter of the through-holes 79 is 0.24 $\mu$m, for example.

2.3 Third Conductive Layer

The third conductive layer is located on the structure shown in FIG. 12. A plurality of drain-gate connecting layers 41a and 41b, the main-word line 43, a plurality of BL contact pad layers 45a and 45b, and a plurality of $V_{SS}$ contact pad layers 47 are disposed in the third conductive layer, as shown in FIG. 8.

The drain-gate connecting layer 41a includes a body section 41a3 and two end sections 41a1 and 41a2. The body section 41a3 extends in the X-axis direction shown in FIG. 8. The end section 41a1 is bent toward the drain-gate connecting layer 41b. The drain-gate connecting layer 41b includes a body section 41b3 and two end sections 41b1 and 41b2. The body section 41b3 extends in the X-axis direction shown in FIG. 8. The end section 41b1 is bent toward the drain-gate connecting layer 41a. A pair of drain-gate connecting layers 41a and 41b is disposed in one memory cell region.

The BL contact pad layers 45a function as pad layers for connecting the bit lines with the n$^+$-type source/drain regions 11a. The BL contact pad layers 45b function as pad layers for connecting the bit-bar lines with the n$^+$-type source/drain regions 11a. Each of the BL contact pad layers 45a and 45b is disposed across two memory cells.

The $V_{SS}$ contact pad layers 47 extend in the Y-axis direction shown in FIG. 8 and have two end sections. The $V_{SS}$ contact pad layers 47 are located between the BL contact pad layer 45a and the BL contact pad layer 45b. One $V_{SS}$ contact pad layer 47 is disposed across two memory cells.

The main-word line 43 extends linearly in the X-axis direction shown in FIG. 8. The main-word line 43 is located above the $V_{DD}$ interconnect 33 shown in FIG. 5. In the present embodiment, the word line consists of the sub-word lines 23 (see FIG. 3) and the main-word line 43 (see FIG. 8). However, the main word line need not be formed.

Each of the end sections 41a1 of the drain-gate connecting layers 41a and the end sections 41b1 of the drain-gate connecting layers 41b is connected to the contact-conductive sections 73 shown in FIG. 12. These connections are indicated by contact sections 73m in FIG. 8. Each of the end sections 41a2 of the drain-gate connecting layers 41a, the end sections 41b2 of the drain-gate connecting layers 41b, the BL contact pad layers 45a and 45b, and the $V_{SS}$ contact pad layers 47 is connected to the contact-conductive sections 75 shown in FIG. 12. These connections are indicated by contact sections 75m in FIG. 8.

The cross sections of the third conductive layer along the line B1–B2 and the line C1–C2 shown in FIG. 8 are respectively shown in FIGS. 14 and 15. The drain-gate connecting layers 41a and 41b, the BL contact pad layer 45b, and the main-word line 43 are illustrated in these cross sections. The third conductive layer including these members has a structure in which a high-melting-point metal nitride layer 42, a metal layer 44, a high-melting-point metal layer 46, and a high-melting-point metal nitride layer 48 are layered in that order from the bottom, for example. Specific examples of each layer are given below. As examples of the high-melting-point metal nitride layer 42, a titanium nitride layer and the like can be given. As examples of the metal layer 44, an aluminum layer, a copper layer, an alloy layer of these metals, and the like can be given. As examples of the high-melting-point metal layer 46, a titanium layer and the like can be given. As examples of the high-melting-point metal nitride layer 48, a titanium nitride layer and the like can be given.

A hard mask layer 40 consisting of a silicon oxide layer is formed on the third conductive layer. The third conductive layer is patterned using the hard mask layer 40 as a mask. This is because it is difficult to pattern the third conductive layer using only a resist as a mask due to miniaturization of memory cells.

Figure 9:
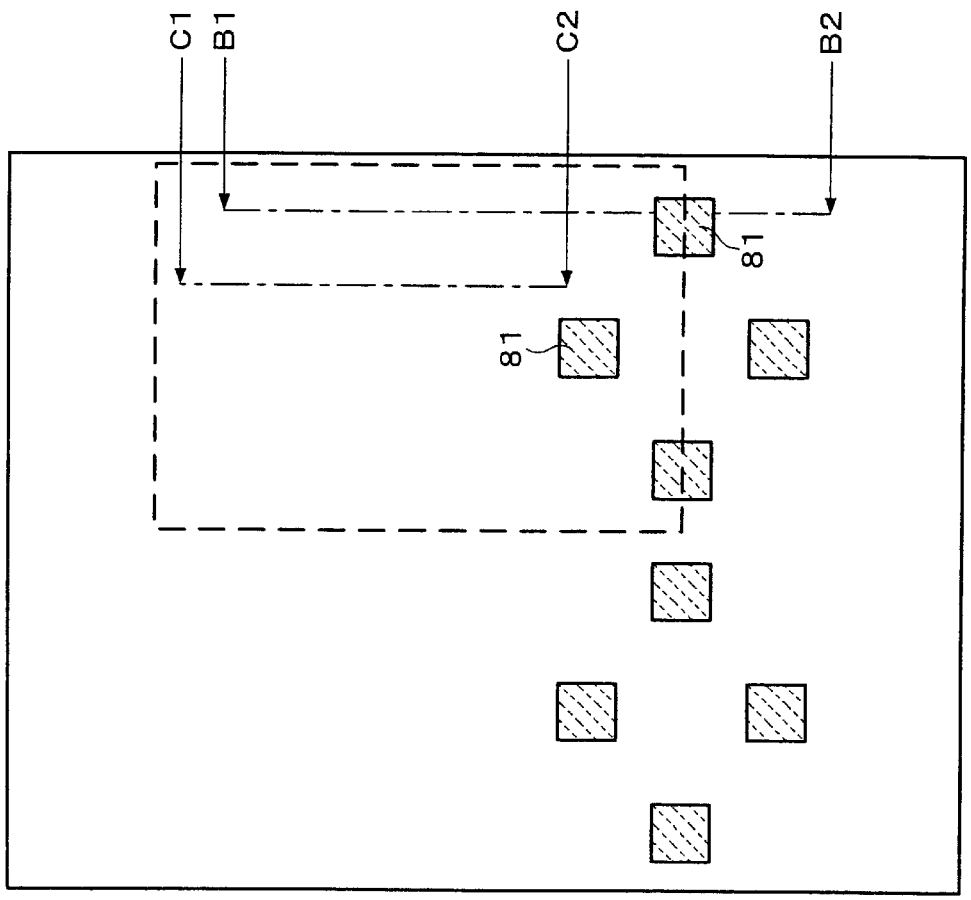
FIG. 9 is a plan view showing a contact-conductive section 81 in part of the memory cell array of the SRAM section according to the embodiment.

An interlayer dielectric 85 such as a silicon oxide layer is formed so as to cover the third conductive layer. The interlayer dielectric 85 is planarized by CMP, as shown in FIGS. 14 and 15. Through-holes 83 for exposing the BL contact pad layers 45a and the like are formed in the interlayer dielectric 85. The through-holes 83 are filled with contact-conductive sections 81. FIG. 13 is a plan view showing this configuration. The contact-conductive sections 81 are connected to the BL contact pad layers 45a and 45b and the $V_{SS}$ contact pad layers 47, as shown in FIG. 13. FIG. 9 is a plan view showing the pattern of the contact-conductive sections 81. Components of the contact-conductive sections 81 are the same as those of the contact-conductive sections 61, 73, and 75. The upper end diameter of the through-holes 83 is 0.36 $\mu$m, for example. The lower end diameter of the through-holes 83 is 0.28 $\mu$m, for example.

2.4 Fourth Conductive Layer

The fourth conductive layer is located on the structure shown in FIG. 13. A plurality of bit lines 51, a plurality of bit-bar lines 53, and a plurality of $V_{SS}$ interconnects 55 are disposed in the fourth conductive layer, as shown in FIG. 10. These lines extend linearly in the Y-axis direction shown in FIG. 10. The $V_{SS}$ interconnects 55 are disposed between the bit line 51 and the bit-bar line 53 at the center of the memory cell. Each of these lines is connected to the contact-conductive sections 81 shown in FIG. 13. These connections are indicated by contact sections 81m in FIG. 10. The bit lines 51 and the like have a structure in which a titanium nitride layer, an aluminum-copper alloy layer, and a titanium nitride layer are provided in that order from the bottom, for example.

The cross section of the fourth conductive layer shown in FIG. 10 along the line B1–B2 is shown in FIG. 14. The bit-bar line 53 is illustrated in this cross section. A signal which compensates a signal flowing through the bit lines 51 flows through the bit-bar lines 53. The details of the structure of the present embodiment are described above.

The patterns shown in FIGS. 1 to 13 are design patterns. These patterns have corner sections. However, in a pattern actually formed on the semiconductor substrate, a line which specifies the corner sections is curved due to the proximity effect of light.

3. Logic Circuit Section 5

Figure 16:
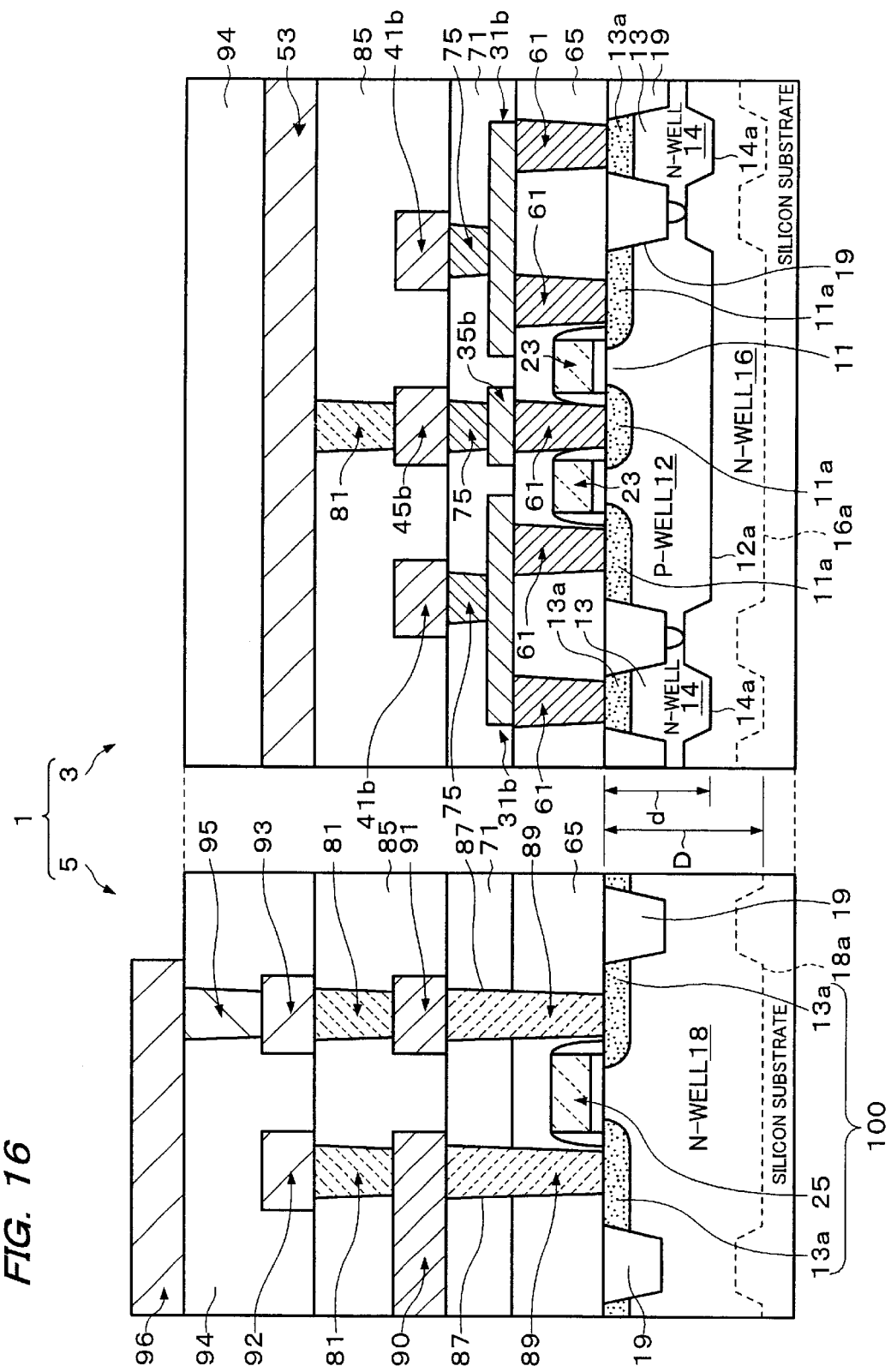
FIG. 16 is across-sectional view showing part of the SRAM section and part of a logic circuit section according to the embodiment.

FIG. 16 is a cross-sectional view showing part of the SRAM section 3 and part of the logic circuit section 5. This cross section of the SRAM section 3 corresponds to the cross section shown in FIG. 14, in which B2 is extended in the Y-axis direction shown in FIG. 2. The detailed structure is not illustrated in FIG. 16. The cross section of the SRAM section 3 is also illustrated in order to describe the corresponding relation between each layer in the logic circuit section 5 and the SRAM section 3. Among the components of the logic circuit section 5, the same components as those of the SRAM section 3 are indicated by the same symbols.

The logic circuit section 5 and the SRAM section 3 are formed on a single silicon substrate. A MOS field effect transistor 100 is illustrated in the logic circuit section 5. In the logic circuit section 5, elements necessary for achieving the function of the logic circuit section 5 are formed. The MOS field effect transistor 100 is formed on an n-well 18 in the silicon substrate. The MOS field effect transistor 100 includes a gate electrode 25 and a pair of $p^+$-type source/drain regions 13$a$. The gate electrode 25 is located in the same layer as the sub-word lines 23. Since the gate electrode 25 is simultaneously formed with the sub-word lines 23, components of the gate electrode 25 are the same as those of the sub-word lines 23. The interlayer dielectric 65 is located so as to cover the gate electrode 25.

In the logic circuit section 5, no interconnect layer is formed on the interlayer dielectric 65. An interconnect layer may be formed on the interlayer dielectric 65. The interlayer dielectric 71 is located on the interlayer dielectric 65. Two contact holes 87 are formed through the interlayer dielectrics 65 and 71. One of the contact holes 87 reaches one of the $p^+$-type source/drain regions 13$a$. The other contact hole 87 reaches the other $p^+$-type source/drain region 13$a$. The contact holes 87 are simultaneously formed with the through-holes 77 shown in FIG. 15. A contact hole which reaches the gate electrode 25 through the interlayer dielectrics 65 and 71 is also formed (not shown). This contact hole is simultaneously formed with the contact holes 87.

The upper end diameter, the lower end diameter, and the depth of the contact holes 87 are respectively 0.32 $\mu$m, 0.22 $\mu$m, and 1.0 $\mu$m, for example. The aspect ratio (depth/lower end diameter) of the contact holes 87 is approximately 4.5. The contact holes 87 are filled with contact-conductive sections 89. Since the contact-conductive sections 89 are simultaneously formed with the contact-conductive sections 73 shown in FIG. 15, components of the contact-conductive sections 89 are the same as those of the contact-conductive sections 73.

A first interconnect layer 90 and an interconnect contact pad 91 are located on the interlayer dielectric 71. The interconnect contact pad is a conductive layer for connecting the interconnect layer with the $p^+$-type source/drain region 13$a$. The interconnect contact pad 91 is connected to one of the contact-conductive sections 89. The first interconnect layer 90 is connected to the other contact-conductive section 89. The first interconnect layer 90 and the interconnect contact pad 91 are located in the same layer as the drain-gate connecting layer 41$b$ and the BL contact pad layer 45$b$. The first interconnect layer 90 and the interconnect contact pad 91 are simultaneously formed with the drain-gate connecting layer 41$b$ and the BL contact pad layer 45$b$. Therefore, components of the first interconnect layer 90 and the interconnect contact pad 91 are the same as those of the drain-gate connecting layer 41$b$ and the BL contact pad layer 45$b$.

The interlayer dielectric 85 is located so as to cover the first interconnect layer 90 and the interconnect contact pad 91. Two contact-conductive sections 81 are formed in the interlayer dielectric 85. One of the contact-conductive sections 81 is connected to the interconnect contact pad 91. The other contact-conductive section 81 is connected to the first interconnect layer 90.

A second interconnect layer 92 and an interconnect contact pad 93 are located on the interlayer dielectric 85. The interconnect contact pad 93 is connected to one of the contact-conductive sections 81. The second interconnect layer 92 is connected to the other contact-conductive section 81. The second interconnect layer 92 and the interconnect contact pad 93 are located in the same layer as the bit-bar line 53. Since the second interconnect layer 92 and the interconnect contact pad 93 are simultaneously formed with the bit-bar line 53, components of the second interconnect layer 92 and the interconnect contact pad 93 are the same as those of the bit-bar line 53.

An interlayer dielectric 94 is located so as to cover the second interconnect layer 92, the interconnect contact pad 93, and the bit-bar line 53. Components of the interlayer dielectric 94 are the same as those of the interlayer dielectric 85. A contact-conductive section 95 is formed in the interlayer dielectric 94. The contact-conductive section 95 is connected to the interconnect contact pad 93. Components of the contact-conductive section 95 are the same as those of other contact-conductive sections. A third interconnect layer 96 is located on the interlayer dielectric 94. The third interconnect layer 96 is connected to the contact-conductive section 95. Components of the third interconnect layer 96 are the same as those of the second interconnect layer 92.

The logic circuit section 5 may have a structure in which the third interconnect layer 96 and the contact-conductive section 95 are not formed. A fourth interconnect layer and a fifth interconnect layer may be formed in addition to the third interconnect layer 96. In addition, the logic circuit section 5 may have a structure including the same interconnect layers as the SRAM section 3.

4. Wells of Semiconductor Device 1

The wells of the semiconductor device 1 are described below in the order of the structure of wells, the effects of wells, and the formation method of wells.

4.1 Structure of Wells

The structure of the wells of the semiconductor device 1 is described below mainly using FIG. 16. First, the structure of the wells disposed in the SRAM section 3 is described.

The p-well 12, the n-wells 14, and the n-well 16 are disposed in the SRAM section 3. The active region 11 is formed on the surface of the p-well 12. The n-channel access transistors $Q_1$ and $Q_2$ and the n-channel driver transistors $Q_3$ and $Q_4$ shown in FIG. 1 are formed in the active region 11. The active region 17 shown in FIG. 2 (not shown) is formed on the surface of the p-well 12. The well contact region for the p well 12 is formed in the active region 17. The active regions 13 are formed on the surface of the n-wells 14. The p-channel load transistors $Q_5$ and $Q_6$ shown in FIG. 1 are formed in the active region 13. The n-well 16 is located under the p-well 12 and the n-wells 14. The n-well 16 is in contact with each n-well 14. Therefore, each n-well 14 is connected to the n-well 16.

Figure 19:
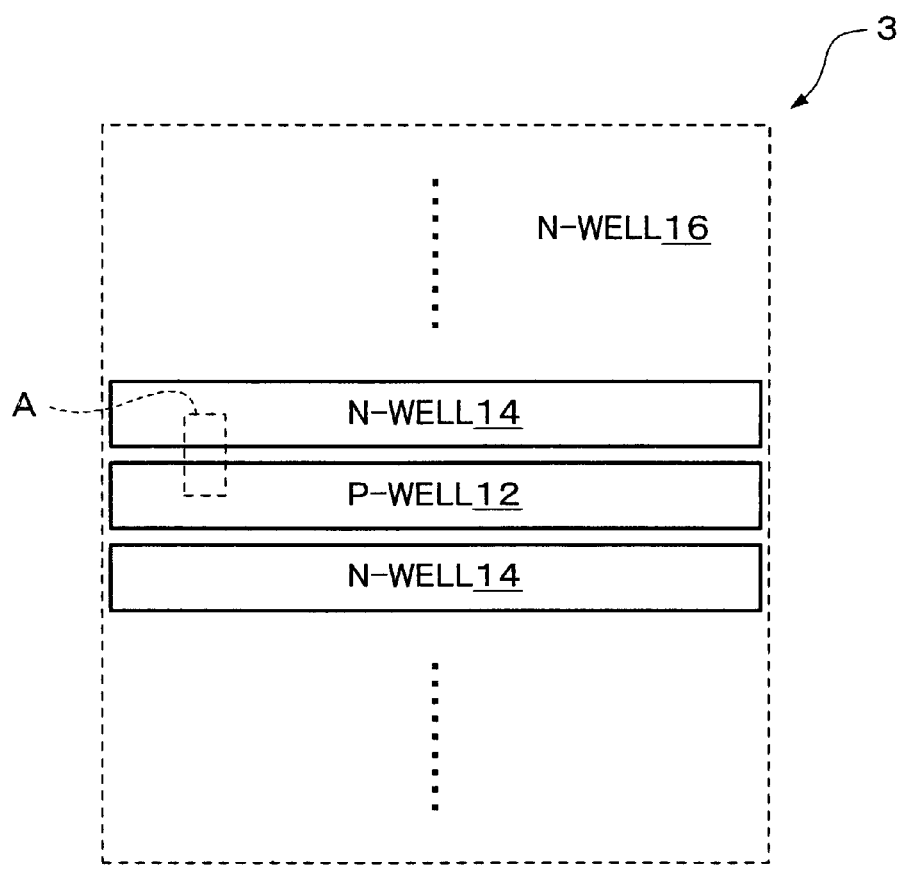
FIG. 19 is a plan view showing the disposition of the wells according to the embodiment.

FIG. 19 is a plan view showing an arrangement relation of the p-well 12, the n-wells 14, and the n-well 16. The planar shape of each of the p-well 12 and the n-wells 14 is rectangular. A plurality of p-wells 12 and a plurality of n-wells 14 are alternately disposed on the n-well 16.

The wells disposed in the logic circuit section 5 are described below. The n-well 18 is disposed in the logic circuit section 5. The n-well 18 is in contact with the n-well 16 at the boundary between the SRAM section 3 and the logic circuit section 5. Therefore, the n-well 18 is connected to the n-well 16.

The depth and the concentration of each well are described below. A bottom section 12a of the p-well 12 is located at a depth d (0.6 to 1.0 μm, for example) from the surface of the silicon substrate. p-type impurities implanted into the p-well 12 are boron, for example. The p-type impurity concentration is from $1 \times 10^{16}$ to $1 \times 10^{18}/cm^3$. A bottom section 14a of the n-well 14 is located at approximately the same depth as the bottom section 12a of the p-well 12. n-type impurities implanted into the n-well 14 are phosphorus, for example. The n-type impurity concentration is from $1 \times 10^{16}$ to $1 \times 10^{18}/cm^3$. A bottom section 16a of the n-well 16 is located at a depth D (0.8 to 3.0 μm, for example) from the surface of the silicon substrate. The value for the depth D is greater than the value for the depth d. n-type impurities implanted into the n-well 16 are phosphorus, for example. The n-type impurity concentration is from $1 \times 10^{15}$ to $1 \times 10^{18}/cm^3$. A bottom section 18a of the n-well 18 is located at approximately the same depth as the bottom section 16a of the n-well 16. n-type impurities implanted into the n-well 18 are phosphorus, for example. The n-type impurity concentration is from $1 \times 10^{15}$ to $1 \times 10^{18}/cm^3$.

4.2 Effects of Wells

The effects of the wells of present embodiment are described below. The n-well 16 supplies the n-well 14 with a potential $V_{DD}$. Therefore, no well contact region is needed for the n-well 14. This enables the SRAM section 3 to be miniaturized. A potential is supplied to the n-well 16 from the n-well 18. A potential is supplied to the n-well 18 from the interconnect layer formed on the silicon substrate through a well contact region for the n-well 18.

According to the present embodiment, the potential $V_{DD}$ is uniformly supplied to the n-well 14 from the n-well 16. This prevents the occurrence of a problem in which the resistance of the n-well 14 is increased in part of the load transistors. Specifically, in the case of forming a well contact region for the n-well 14, the resistance of the n-well 14 is increased in the load transistor apart from the well contact region, thereby causing latchup to occur.

A potential is supplied to the n-well 16 from the n-well 18. However, the present invention is not limited thereto. For example, a well contact region for then-well 16 maybe formed at the circumference of the SRAM section 3 shown in FIG. 19, and the potential may be supplied to the n-well 16 therefrom. Generally, the substrate current is increased in the logic circuit section 5 due to high drive capability of the transistors. The substrate current in the logic circuit section 5 is prevented from flowing into the memory cell region by disposing the well contact region at the boundary between the n-well 16 and the n-well 18. This prevents the occurrence of latchup more reliably.

In the present embodiment, the n-well 16 is disposed under the p-well 12 in the form of a buried layer. A potential $V_{SS}$ and a potential $V_{DD}$ are respectively supplied to the p-well 12 and the n-well 16. A reverse biased pn junction is formed between the p-well 12 and the n-well 16. In the case where the potential of the $n^+$-type drains 11a (drains of driver transistors $Q_3$ and $Q_4$, for example) on the p-well 12 is $V_{DD}$, a reverse biased pn junction is also formed between the $n^+$-type drains 11a and the p-well 12. In the case where a depletion layer in the pn junction between the $n^+$-type drains 11a and the p-well 12 is distorted due to funneling when α-rays are incident on the $n^+$-type drains 11a, the n-well 16 at the potential $V_{DD}$ functions as a guard band. Specifically, the amount of charge flowing into the $n^+$-type drain 11a due to funneling is limited only to the extent of the depth of the p-well 12. The amount of charge flowing into the $n^+$-type drain 11a is significantly decreased in comparison with the case where the n-well 16 is not present under the p-well 12 (in particular, in the case where the silicon substrate is p-type). Therefore, in the present embodiment, occurrence of soft errors due to α-rays can be prevented.

4.3 Formation Method of Wells

A formation method for the wells shown in FIG. 16 is described below with reference to FIGS. 20 to 23. In FIGS. 20 to 23, a region R1 shows a formation region of the SRAM section 3 and a region R2 shows a formation region of the logic circuit section 5.

Figure 20:
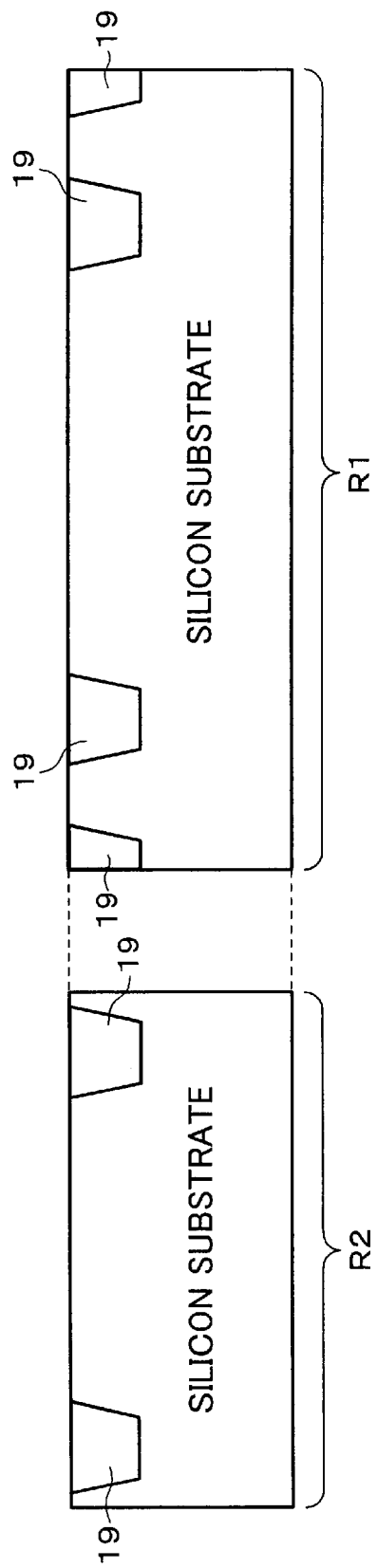
FIG. 20 is a plan view showing a first step of a method of forming the wells according to the embodiment.

First, the element isolation regions 19 are formed on the surface of the p-type silicon substrate by Shallow Trench Isolation (STI), as shown in FIG. 20. A resist pattern (not shown) with a thickness of 3.0 to 8.0 μm, for example, is formed on the surface of the silicone substrate. The entire surface of the region R1 and part of the region R2 are exposed by the resist pattern.

Figure 21:
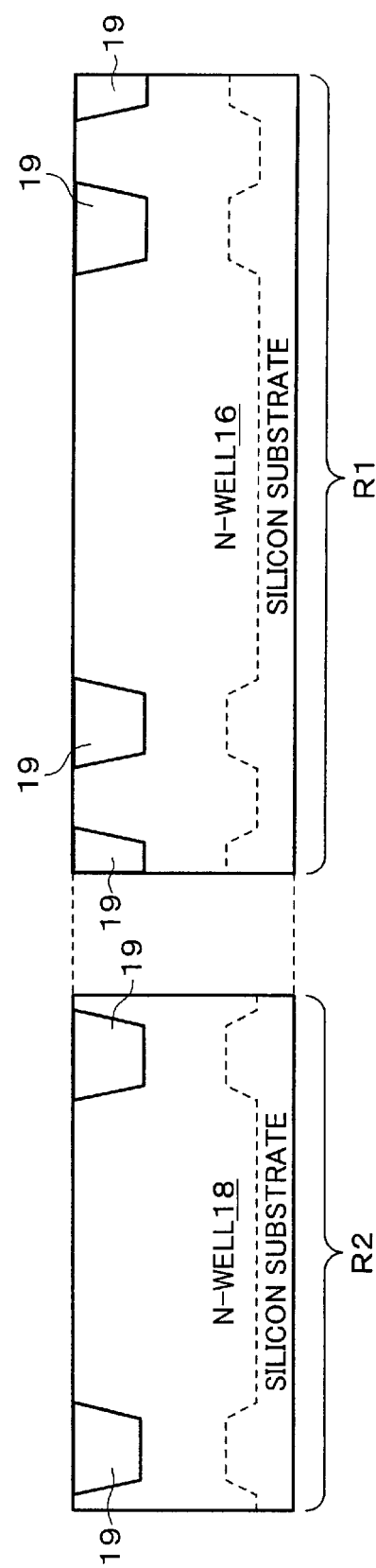
FIG. 21 is a plan view showing a second step of a method of forming the wells according to the embodiment.

Ions are implanted into the silicon substrate using the resist pattern as a mask, whereby the n-well 16 and the n-well 18 are respectively formed in the regions R1 and R2, as shown in FIG. 21. The ions are phosphorus ions, the implantation energy is from 500 KeV to 3 MeV, and the dose is from 5E12 to 5E13, for example.

Figure 22:
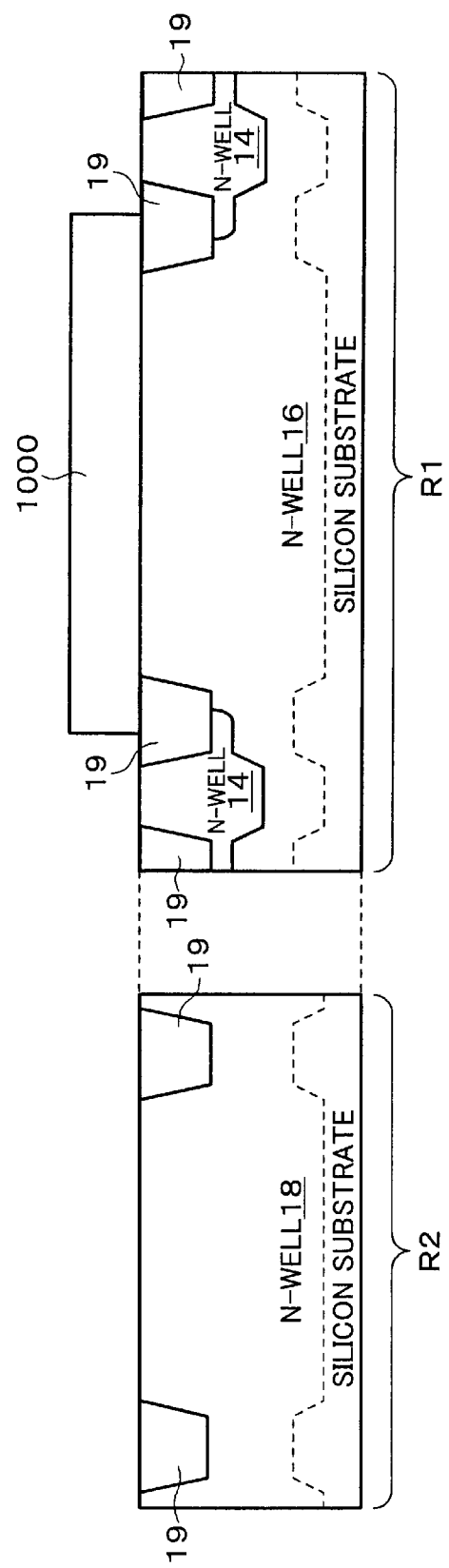
FIG. 22 is a plan view showing a third step of a method of forming the wells according to the embodiment.

A resist pattern 1000 is formed on the silicon substrate so as to expose the formation regions of the n-well 14 and the n-well 18, as shown in FIG. 22. The thickness of the resist pattern 1000 is 1.2 to 2.5 μm, for example. Ions are implanted into the silicon substrate using the resist pattern 1000 as a mask, whereby the n-wells 14 are formed in the region R1.

The n-wells 14 are formed by the combination of the following three types of ion implantations. First, a channel cut layer is formed. The ions are phosphorus ions, the implantation energy is 200 to 500 KeV, and the dose is from 3E12 to 2E13, for example. Next, a punch-through stopper layer is formed. The ions are phosphorus ions, the implantation energy is 100 to 200 KeV, and the dose is from 12E12 to 1E13, for example. Then, a channel doping layer is formed. The ions are phosphorus ions, the implantation energy is 20 to 100 KeV, and the dose is from 1E12 to 1.2E13, for example. Ions are also implanted into the n-well 18 by this ion implantation. Ion implantation for forming the channel doping layer may be carried out for the n-well 14 in the region R1 and the n-well 18 in the region R2 at different doses.

Figure 23:
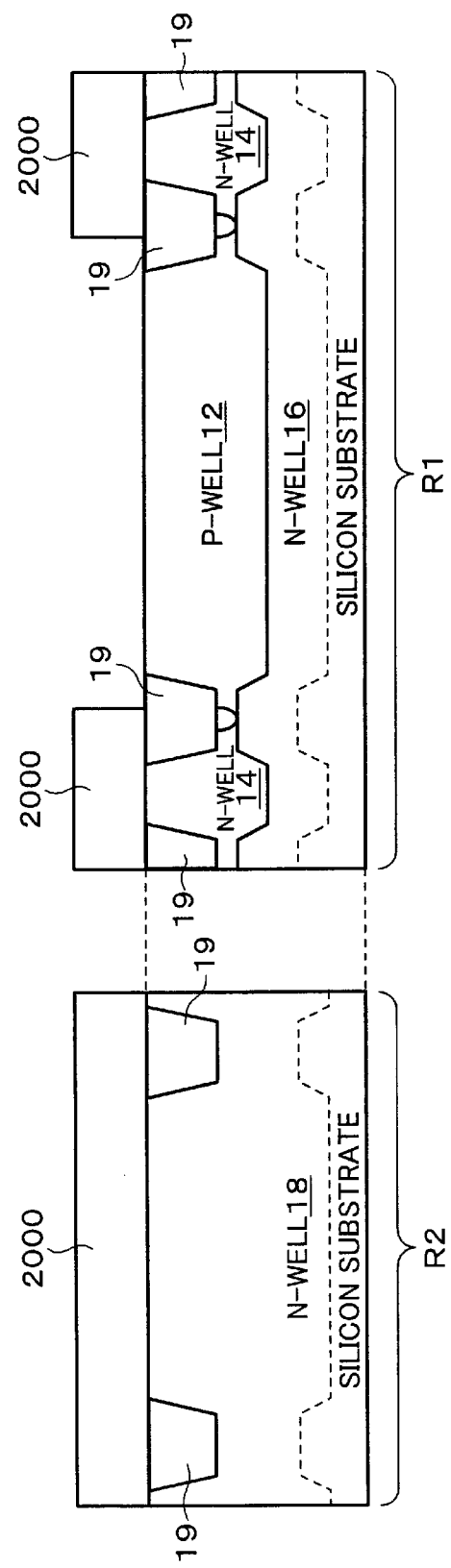
FIG. 23 is a plan view showing a fourth step of a method of forming the wells according to the embodiment.

A resist pattern 2000 is formed on the silicon substrate so as to expose the formation region of the p-well 12, as shown in FIG. 23. The thickness of the resist pattern 2000 is 1.2 to 2.5 μm, for example. Ions are implanted into the silicon substrate using the resist pattern 2000 as a mask, whereby the p-well 12 is formed in the region R1.

The p-well 12 is formed by the combination of the following three types of ion implantation. First, a channel cut layer is formed. The ions are boron ions, the implantation energy is 100 to 300 KeV, and the dose is from 3E12 to 2E13, for example. Next, a punch-through stopper layer is formed. The ions are boron ions, the implantation energy is 50 to 200 KeV, and the dose is from 2E12 to 1E13, for example. Then, a channel doping layer is formed. The ions are boron difluoride ions, the implantation energy is 30 to 150 KeV, and the dose is from 1E12 to 1.2E13, for example.

The wells shown in FIG. 16 are thus formed.

5. Redundant Circuit in SRAM Section 3

The SRAM section 3 includes a redundant circuit. The structure of the redundant circuit in the SRAM section 3, the major effects of the redundant circuit, and a power supply disconnecting circuit in the SRAM section 3 are described below in that order.

5.1 Structure of Redundant Circuit in SRAM Section 3

Figure 24:
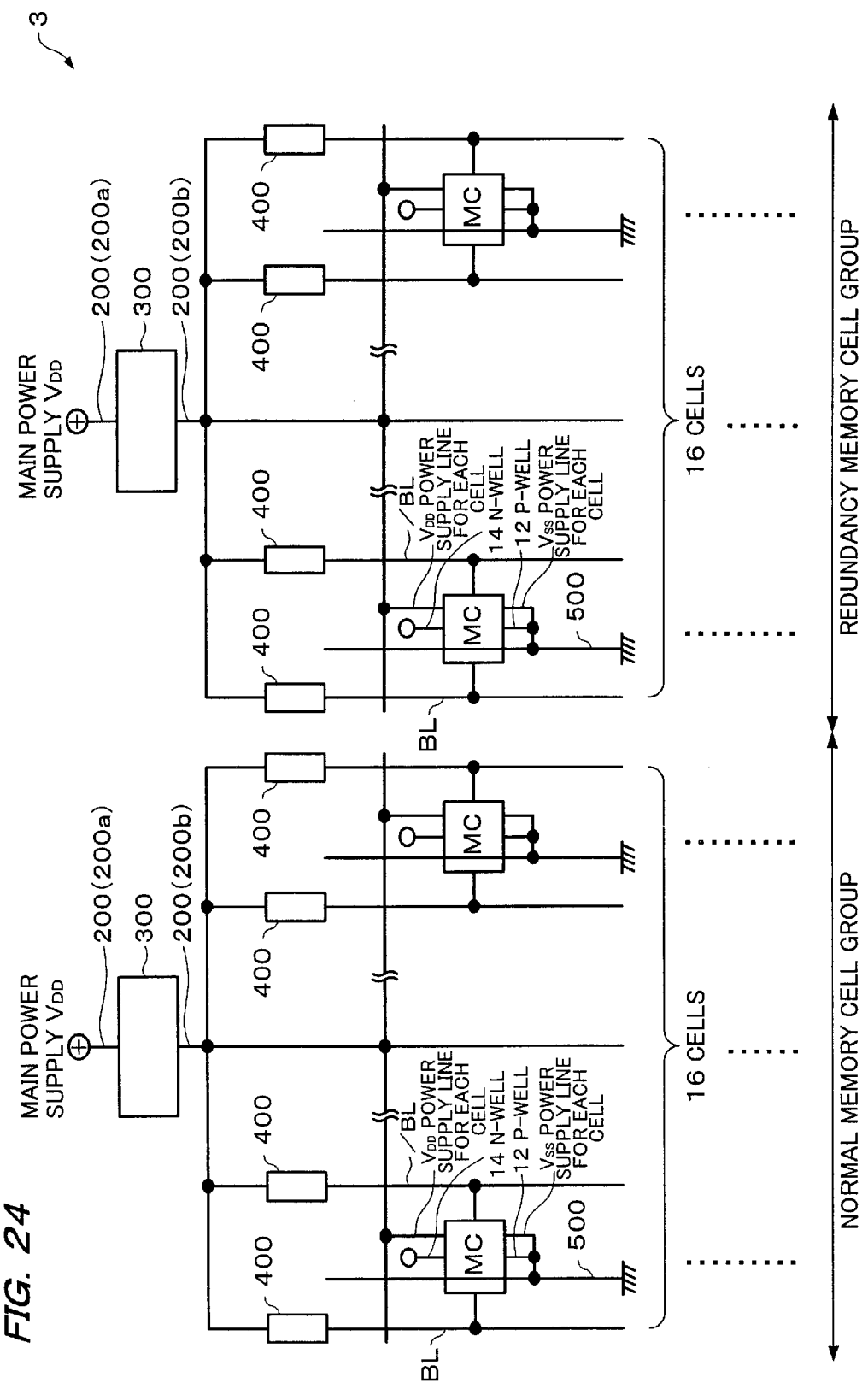
FIG. 24 is a circuit block diagram showing part of the SRAM section according to the embodiment.

FIG. 24 is a circuit block diagram showing part of the SRAM section 3. A plurality of memory cells MC is arranged in the SRAM section 3 in a matrix. Each memory cell MC has a circuit structure shown in FIG. 17.

The SRAM section 3 includes a plurality of memory cell groups. Each memory cell group consists of a specific number of columns (16, for example) of memory cells MC. Therefore, sixteen memory cells MC are arranged in the row direction in one memory cell group. The memory cell groups include normal memory cell groups and redundant memory cell groups. One redundant memory cell group is formed for every specific number (128, for example) of normal memory cell groups.

Each memory cell group includes a power supply line 200 for the memory cell group connected to a main power supply $V_{DD}$. The power supply line 200 for the memory cell group supplies a potential to the bit line and the bit-bar line in the memory cell group through bit line precharge circuits 400. The power supply line 200 for the memory cell group supplies a potential to a $V_{DD}$ power supply line for each cell in the memory cell group.

A power supply disconnecting circuit 300 is connected to the power supply line 200 for the memory cell group. The power supply disconnecting circuit 300 has a function of disconnecting the $V_{DD}$ power supply line for each cell from the main power supply $V_{DD}$. The details of the power supply disconnecting circuit 300 are described later. In the SRAM section 3, a ground line 500 is arranged in every column.

Each memory cell MC includes a $V_{SS}$ power supply line for each cell. Part of the $V_{SS}$ power supply line for each cell is the $V_{SS}$ interconnect 55 shown in FIG. 10. The $V_{SS}$ power supply line for each cell and the p-well 12 are connected to the ground line 500.

Each memory cell MC includes a $V_{DD}$ power supply line for each cell. Part of the $V_{DD}$ power supply line for each cell is the $V_{DD}$ interconnect 33 shown in FIG. 5. The $V_{DD}$ power supply line for each cell in each memory cell MC is connected to the power supply line 200 for the memory cell group including this memory cell MC. The $V_{DD}$ power supply line for each cell is not connected to the n-well 14. A potential $V_{DD}$ is supplied to the n-well 14 through another route through the n-well 18 and the n-well 16 shown in FIG. 16.

5.2 Major Effects of Redundant Circuit

In the case where unnecessary current flows into a certain memory cell MC through the $V_{DD}$ power supply line for each cell and the bit line or bit-bar line, this memory cell is a defective memory cell. In the present embodiment, the normal memory cell group including this defective memory cell MC is replaced by the redundant memory cell group. In order to prevent the current from flowing into the defective memory cell MC, this normal memory cell group is disconnected from the main power supply $V_{DD}$ by blowing a fuse in the power supply disconnecting circuit 300.

Since the power supply route for the n-well 14 differs from the $V_{DD}$ power supply line for each cell, current from the $V_{DD}$ power supply line for each cell in the adjacent memory cell group does not flow into the defective memory cell MC. Specifically, the n-well 14 in a certain memory cell group is connected to the n-well 14 in the adjacent memory cell group. If the power supply route for the n-well 14 is the same as the $V_{DD}$ power supply line for each cell, current flows into the defective memory cell MC through the n-well 14 in the adjacent memory cell group even if the normal memory cell group including the defective memory cell MC is disconnected from the main power supply $V_{DD}$.

According to the present embodiment, the $V_{DD}$ power supply line for each cell is disconnected from the main power supply $V_{DD}$ using each memory cell group as one unit. Therefore, the area of the SRAM section 3 can be decreased in comparison with the case of disconnecting the $V_{DD}$ power supply line for each cell using each $V_{DD}$ power supply line as one unit. In the present embodiment, the power supply line for each cell may be disconnected using the power supply line for each cell as one unit.

5.3 Power Supply Disconnecting Circuit

Figure 25:
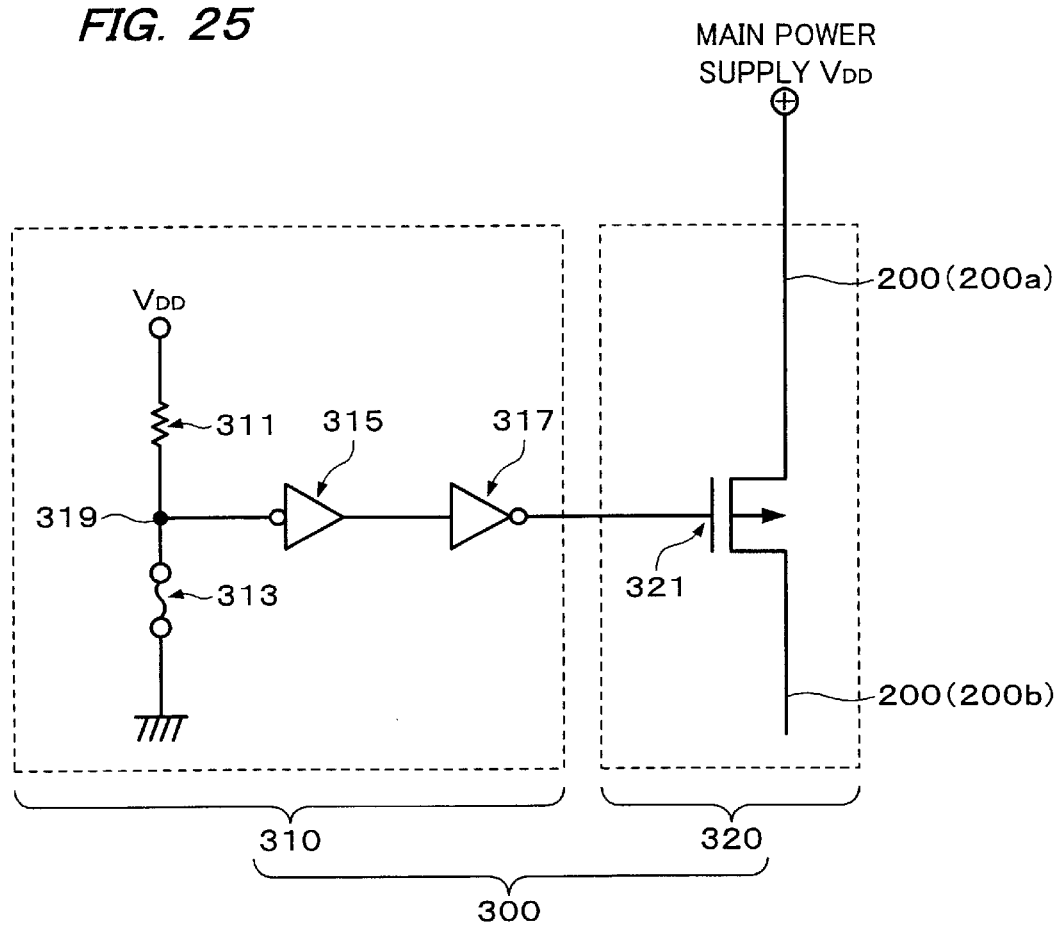
FIG. 25 is a circuit diagram showing a power supply disconnecting circuit in the SRAM section according to the embodiment.

As the power supply disconnecting circuit 300, a conventional power supply disconnecting circuit may be used. An example of the power supply disconnecting circuit 300 is described below with reference to FIG. 25. FIG. 25 shows a power supply disconnecting circuit disclosed in Japanese Patent Application Laid-open No. 9-265792. The structure of the power supply disconnecting circuit 300 is described below. The power supply disconnecting circuit 300 includes a program circuit 310 and a switching circuit 320.

The program circuit 310 includes a resistance 311, a fuse 313, and inverters 315 and 317. The resistance 311 and the fuse 313 are connected in series. An input terminal of the inverter 315 is connected to wiring for connecting the resistance 311 and the fuse 313. An input of the inverter 315 is active LOW. An output terminal of the inverter 315 is connected to an input terminal of the inverter 317.

The switching circuit 320 includes a p-channel MOS transistor 321. The power supply line 200 (200a) for the memory cell group is connected to one of sources/drains of the MOS transistor 321. The power supply line 200 (200b) for the memory cell group is connected to the other source/drain of the MOS transistor 321. An output terminal of the inverter 317 is connected to a gate of the MOS transistor 321.

The operation of the power supply disconnecting circuit 300 is described below. The resistance value of the fuse 313 is sufficiently lower than that of the resistance 311. Therefore, in the case where the fuse 313 is not blown, the potential of a node 319 becomes a level LOW. Therefore, the p-channel MOS transistor 321 is turned ON, whereby a potential is supplied to the $V_{DD}$ power supply line for each cell (see FIG. 24) from the main power supply $V_{DD}$ through the power supply line 200 for the memory cell group.

In the case where a certain memory cell MC (see FIG. 24) is defective, the fuse 313 of the power supply disconnecting circuit 300 in the normal memory cell group including the defective memory cell MC is blown using a laser or the like. This allows the potential of the node 319 to be a level HIGH, whereby the p-channel MOS transistor 321 is turned OFF. As a result, the $V_{DD}$ power supply line for each cell (see FIG. 24) is disconnected from the main power supply $V_{DD}$. The power supply disconnecting circuit 300 is not limited to this structure. A low resistance fuse-link may be used.

What is claimed is:

1. A semiconductor device, comprising:
   an SRAM section which includes a plurality of memory cells, wherein each of the memory cells comprises:
   a first well of a primary conductivity type,
   a second well of a secondary conductivity type,
   a first load transistor and a second load transistor, a first driver transistor and a second driver transistor,
a first access transistor and a second access transistor,
wherein the first and second load transistors are located on the first well,
wherein the first and second driver transistors and the first and second access transistors are located on the second well; and
a third well of the primary conductivity type, wherein a bottom section of the third well is located at a position deeper than bottom sections of the first and second wells, wherein the third well is connected to the first well in each of the memory cells, wherein:
each of the memory cells has first and second gate-gate electrode layeres, first and second drain-drain connecting layers, and first and second drain-gate connecting layers;
the first gate-gate electrode layer includes gate electrodes of the first load transistor and the first driver transistor;
the second gate-gate electrode layer includes gate electrodes of the second load transistor and the second driver transistor;
the first drain-drain connecting layer connects a drain of the first load transistor with a drain of the first driver transistor;
the second drain-drain connecting layer connects a drain of the second load transistor with a drain of the second driver transistor;
the first and second gate-gate electrode layers are located between the first and second drain-drain connecting layers;
the first drain-gate connecting layer connects the first drain-drain connecting layer with the second gate-gate electrode layer;
the second drain-gate connecting layer connects the second drain-drain connecting layer with the first gate-gate electrode layer; and
each of the drain-gate connecting layers, the drain-drain connecting layers, and the gate-gate electrode layers is located in different layers.

2. The semiconductor device as defined in claim 1, further comprising a semiconductor circuit section, wherein:
the semiconductor circuit section comprises a fourth well of the primary conductivity type; and
the fourth well is connected to the third well.

3. The semiconductor device as defined in claim 1, wherein:
the SRAM section includes a normal memory cell group and a redundant memory cell group; and
the normal memory cell group is able to be replaced by the redundant memory cell group.

4. The semiconductor device as defined in claim 3, wherein:
each of the memory cells has a power supply line for a cell;
the power supply line for a cell supplies a potential to the first and second load transistors in each of the memory cells;
the power supply line for a cell is electrically isolated from the third well;
each of the normal and redundant memory cell groups has a power supply line for a memory cell group;
the power supply line for a memory cell group supplies a potential to the first and second load transistors in each of the memory cells;
the power supply line for a cell is electrically isolated from the third well;
each of the normal and redundant memory cell groups has a power supply line for a memory cell group;
the power supply line for a memory cell group supplies a potential to the power supply lines for a cell in each of the normal and redundant memory cell groups;
the power supply line for a memory cell group includes a power supply disconnecting circuit; and
the power supply line for a cell is able to be disconnected from a power supply by the power supply disconnecting circuit.

5. The semiconductor device as defined in claim 4, wherein:
the power supply line for a memory cell group supplies a potential to a bit-line precharge circuit for each of the memory cells; and
the bit-line precharge circuit is able to be disconnected from a power supply by the power supply disconnecting circuit.

6. The semiconductor device as defined in claim 4, wherein:
the plurality of memory cells makes up a memory cell array; and
each of the normal and redundant memory cell groups includes a plurality of columns of the memory cells in the memory cell array.

7. The semiconductor device as defined in claim 1, wherein:
the primary conductivity type is an n-type;
the secondary conductivity type is a p-type;
a $V_{DD}$ power supply is connected to the first and third wells; and
a $V_{SS}$ power supply is connected to the second well.

8. The semiconductor device as defined in claim 1, wherein a well contact region is provided for every two memory cells in the second well.

9. A semiconductor device, comprising:
an SRAM section which includes a plurality of memory cells, wherein each of the memory cells comprises: a first well of a primary conductivity type; a second well of a secondary conductivity type; a first load transistor and a second load transistor, wherein the first and second load transistors are a first driver transistor and a second driver transistor, wherein the first and second driver transistors are located on the second well; a first access transistor and a second access transistor, wherein the first and second access transistors are located on the second well; and a third well of the primary conductivity type, wherein a bottom section of the third well is located at a position deeper than bottom sections of the first and second wells, and wherein the third well is connected to the first well in each of the memory cells; and
a semiconductor circuit section comprising a fourth well of the primary conductivity type, wherein the fourth well is connected to the third well.

10. The semiconductor device as defined in claim 9, wherein the SRAM section has no well contact region in the third well.

11. The semiconductor device as defined in claim 9, wherein the SRAM section has a well contact region in the third well.

12. The semiconductor device as defined in claim 9, wherein:
the SRAM section includes a normal memory cell group and a redundant memory cell group; and the normal memory cell group is able to be replaced by the redundant memory cell group.

13. The semiconductor device as defined in claim 12, wherein:
each of the memory cells has a power supply line for a cell;
the power supply line for a cell supplies a potential to the first and second load transistors in each of the memory cells;
the power supply line for a cell is electrically isolated from the third well;
each of the normal and redundant memory cell groups has a power supply line for a memory cell group;
the power supply line for a memory cell group supplies a potential to the power supply lines for a cell in each of the normal and redundant memory cell groups;
the power supply line for a memory cell group includes a power supply disconnecting circuit; and
the power supply line for a cell is able to be disconnected from a power supply by the power supply disconnecting circuit.

14. The semiconductor device as defined in claim 13, wherein:
the power supply line for a memory cell group supplies a potential to a bit-line precharge circuit for each of the memory cells; and
the bit-line precharge circuit is able to be disconnected from a power supply by the power supply disconnecting circuit.

15. The semiconductor device as defined in claim 12, wherein:
the plurality of memory cells makes up a memory cell array; and
each of the normal and redundant memory cell groups includes a plurality of columns of the memory cells in the memory cell array.

16. The semiconductor device as defined in claim 9, wherein:
each of the memory cells has first and second gate-gate electrode layers, first and second drain-drain connecting layers, and first and second drain-gate connecting layers;
the first gate-gate electrode layer includes gate electrodes of the first load transistor and the first driver transistor;
the second gate-gate electrode layer includes gate electrodes of the second load transistor and the second driver transistor;
the first drain-drain connecting layer connects a drain of the first load transistor with a drain of the first driver transistor;
the second drain-drain connecting layer connects a drain of the second load transistor with a drain of the second driver transistor;
the first and second gate-gate electrode layers are located between the first and second drain-drain connecting layers;
the first drain-gate connecting layer connects the first drain-drain connecting layer with the second gate-gate electrode layer;
the second drain-gate connecting layer connects the second drain-drain connecting layer with the first gate-gate electrode layer; and
each of the drain-gate connecting layers, the drain-drain connecting layers, and the gate-gate electrode layers is located in different layers.

17. The semiconductor device as defined in claim 9, wherein:
the primary conductivity type is an n-type;
the secondary conductivity type is a p-type;
a $V_{DD}$ power supply is connected to the first and third wells; and
a $V_{SS}$ power supply is connected to the second well.

18. The semiconductor device as defined in claim 9, wherein a well contact region is provided for every two memory cells in the second well.

19. A semiconductor device, comprising:
an SRAM section which includes a plurality of memory cells, wherein each of the memory cells comprises:
a first well of a primary conductivity type;
a second well of a secondary conductivity type;
a first load transistor and a second load transistor, wherein the first and second load transistors are located on the first well;
a first driver transistor and a second driver transistor, wherein the first and second driver transistors are located on the second well;
a first access transistor and a second access transistor, wherein the first and second access transistors are located onto the second well; and
a third well of the primary conductivity type, wherein a bottom section of the third well is located at a position deeper than bottom sections of the first and second well, wherein the third well is connected to the first well in each of the memory cells,
wherein the SRAM section includes a normal memory cell group and a redundant memory cell group, wherein the normal memory cell group is able to be replaced by the redundant memory cell group.

20. The semiconductor device as defined in claim 19, wherein the SRAM section has no well contact region in the third well.

21. The semiconductor device as defined in claim 19, wherein the SRAM section has a well contact region in the third well.

22. The semiconductor device as defined in claim 19, wherein:
each of the memory cells has a power supply line for a cell;
the power supply line for a cell supplies a potential to the first and second load transistors in each of the memory cells;
the power supply line for a cell is electrically isolated from the third well;
each of the normal and redundant memory cell groups has a power supply line for a memory cell group;
the power supply line for a memory cell group supplies a potential to the power supply lines for a cell in each of the normal and redundant memory cell groups;
the power supply line for a memory cell group includes a power supply disconnecting circuit; and
the power supply line for a cell is able to be disconnected from a power supply by the power supply disconnecting circuit.

23. The semiconductor device as defined in claim 22, wherein:
the power supply line for a memory cell group supplies a potential to a bit-line precharge circuit for each of the memory cells; and
the bit-line precharge circuit is able to be disconnected for a power supply by the power supply disconnecting circuit.

24. The semiconductor device as defined in claim 19, wherein:

the plurality of memory cells makes up a memory cell array; and each of the normal and redundant memory cell groups includes a plurality of columns of the memory cells in the memory cell array.

25. The semiconductor device as defined in claim 19, wherein:

each of the memory cells has first and second gate-gate electrode layers, first and second drain-drain connecting layers, and first and second drain-gate connecting layers;

the first gate-gate electrode layer includes gate electrodes of the first load transistor and the first driver transistor;

the second gate-gate electrode layer includes gate electrodes of the second load transistor and the second driver transistor;

the first drain-drain connecting layer connects a drain of the second load transistor with a drain of the second driver transistor;

the second drain-drain connecting layer connects a drain of the second load transistor with a drain of the second driver transistor;

the first and second gate-gate electrode layers are located between the first and second drain-drain connecting layers;

the first drain-gate connecting layer connects the first drain-drain connecting layer with the second gate-gate electrode layer;

the second drain-gate connecting layer connects the second drain-drain connecting layer with the first gate-gate electrode layer; and each of the drain-gate connecting layers, the drain-drain connecting layers, and the gate-gate electrode layers is located in different layers.

26. The semiconductor device as defined in claim 19, wherein:

the primary conductivity type is an n-type;

the secondary conductivity type is a p-type;

a $V_{DD}$ power supply is connected to the first and third wells; and a $V_{SS}$ power supply is connected to the second well.

27. The semiconductor device as defined in claim 19, wherein a well contact region is provided for every two memory cells in the second well.

* * * * *